US012745496B2

(12) United States Patent
Miyasaka et al.

(10) Patent No.: US 12,745,496 B2
(45) Date of Patent: Sep. 22, 2026

(54) DISPLAY APPARATUS

(71) Applicant: Japan Display Inc., Tokyo (JP)

(72) Inventors: Koichi Miyasaka, Tokyo (JP); Yoshikatsu Imazeki, Tokyo (JP); Yoichi Kamijo, Tokyo (JP); Shuichi Osawa, Tokyo (JP); Yoshifumi Kamei, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 339 days.

(21) Appl. No.: 18/624,208

(22) Filed: Apr. 2, 2024

(65) Prior Publication Data

US 2024/0339581 A1 Oct. 10, 2024

(30) Foreign Application Priority Data

Apr. 4, 2023 (JP) ................................ 2023-060913

(51) Int. Cl.

| | |
|---|---|
| ***H10H 20/857*** | (2025.01) |
| ***H10H 20/831*** | (2025.01) |
| ***H10W 90/00*** | (2026.01) |

(52) U.S. Cl.

CPC ...... *H10H 20/857* (2025.01); *H10H 20/8312* (2025.01); *H10W 90/00* (2026.01)

(58) Field of Classification Search

CPC ............. H10H 20/857; H10H 20/8312; H10H 20/0364

See application file for complete search history.

(56) References Cited

U.S. PATENT DOCUMENTS 12,520,646 B2 * 1/2026 Park .................... H10H 29/142
2022/0209081 A1 6/2022 Abe et al.

FOREIGN PATENT DOCUMENTS

JP 2021-048373 A 3/2021

* cited by examiner

*Primary Examiner* — Matthew L Reames

(74) *Attorney, Agent, or Firm* — XSENSUS LLP

(57) ABSTRACT

Performance of a display apparatus is improved. The display apparatus includes: a first terminal electrically connected to a first electrode of an LED element (inorganic light emitting diode element); and a second terminal electrically connected to an electrode of the LED element. In plan view, the first terminal is at a position overlapping the LED element, and the second terminal is arranged to continuously surround the LED element.

10 Claims, 16 Drawing Sheets

DSP1(PIXA,PIXC,PIXC)
SUB1
TM2
10f
CH2(CH)
MW2
ES
50
EG
ED
DRT
MW1
CH1(CH)
PL2
10b
20f
20b
20E2
20LL
20E1
20
MB1
TM1
CP1
15
TM2
14
13
12
11
10
WL4
WL3
WL2
WL1
Z
Y-X

DSP2(PIXA,PIXC,PIXC,PIXC)
SUB1
14f
30
TM2
30s1
10f
H20LL
20f
20b
CH2(CH)
H20f
MW2
20E2
20LL
20E1
20
ES
50
EG
ED
DRT
MB1
TM1
D20E1
MW1
H30
CH1(CH)
CP1
D30
PL2
15f
10b
WL4
15
TM2
TTM2
WL3
14
WL2
13
12
WL1
11
10
Y-X
Z

DSP4
20B
TM2
PIXB(PIX)
20A
TM2
PIXA(PIX)
20E2
TM3
TMH2
20E2
TM1
TMH1
C
C
X
Y

FIG. 12

DSP4

PIXA PIXA

SUB1 CP1 TM2 MB1 TM3 20E2 20LL 20E1 20B TMH2 PL2 TM2 CH3(CH) MB1 TM1 20E2 20LL 20E1 20A TMH1 TM2 15 14

Z X

DSP5
20B
TM2
PIXB(PIX)
20A
30
PIXA(PIX)
20E2
TM3
TMH2
TM2
20E2
TM1
TMH1
D
D
X
Y

FIG. 14

DSP5

PIXA PIXA

30 SUB1 CP1 TM2 MB1 TM3 20B 20E2 20LL 20E1 TMH2 PL2 30 TM2 CH3(CH) MB1 TM1 20A 20E2 20LL 20E1 TMH1 TM2 15 30 14 Z X

DISPLAY APPARATUS

CROSS-REFERENCE TO RELATED APPLICATION

The present application claims priority to Japanese Patent Application No. 2023-060913, filed on Apr. 4, 2023, the disclosure of which is incorporated herein by reference.

TECHNICAL FIELD OF THE INVENTION

The present invention relates to a display apparatus.

BACKGROUND OF THE INVENTION

A Light Emitting Diode (LED) display apparatus in which light emitting diode elements that are self-luminous elements are arranged in matrix form on a substrate is exemplified as the display apparatus. For example, Japanese Patent Application Laid-open Publication No. 2021-48373 (Patent Document 1) describes a display apparatus in which a metal layer is arranged around a microLED.

SUMMARY OF THE INVENTION

In the LED display apparatus, a plurality of LED elements mounted on the substrate are used as a light source. Each of the plurality of LED elements peripherally emits light in all directions. In order to improve the consumed power of the display apparatus, the light emitted from the LED element toward the substrate is preferably reflected toward a front surface of the display apparatus.

A display apparatus according to one aspect of the present invention includes: a first inorganic light emitting diode element including a first electrode on a first main surface and a second electrode on a second main surface opposite to the first main surface; a first terminal electrically connected to the first electrode; a second terminal electrically connected to the second electrode; a first insulating layer covering the first terminal, the first inorganic light emitting diode element and the second terminal; and a first conductor pattern arranged on the first insulating layer and electrically connected to each of the second electrode and the second terminal of the first inorganic light emitting diode element. In plan view, the first terminal is at a position overlapping the first inorganic light emitting diode element, and the second terminal is arranged to continuously surround the first inorganic light emitting diode element.

BRIEF DESCRIPTIONS OF THE DRAWINGS

FIG. 12 is an enlarged cross-sectional view taken along a line C-C in FIG. 11.

FIG. 14 is an enlarged cross-sectional view taken along a line D-D in FIG. 13.

DESCRIPTIONS OF THE PREFERRED EMBODIMENTS

Figure 1:
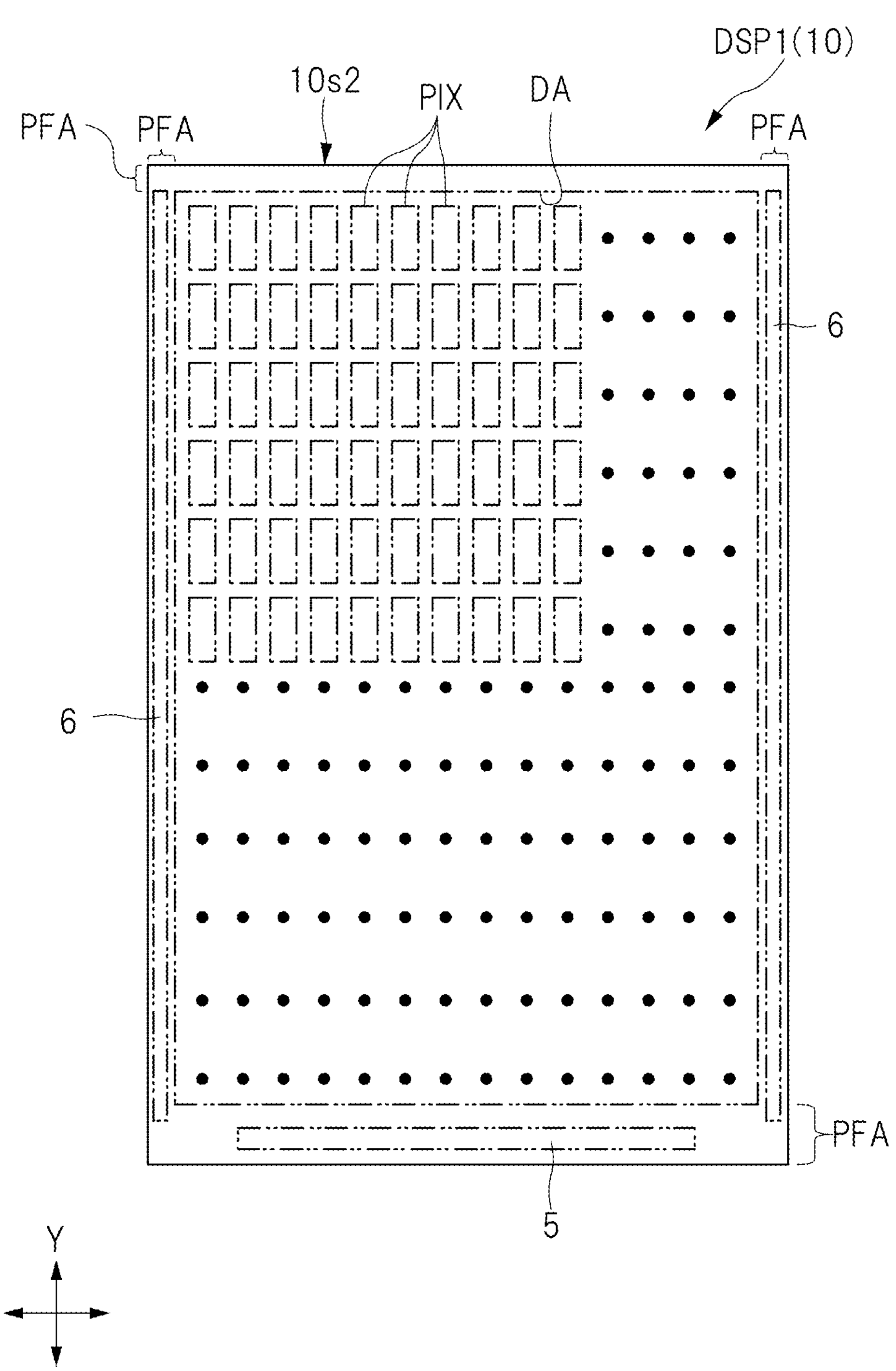
FIG. 1 is a plan view showing a configuration example of a display apparatus according to an embodiment.

The following is explanation on each embodiment of the present invention with reference to drawings. Note that only one example is disclosed, and appropriate modification with keeping the concept of the present invention which can be easily anticipated by those who are skilled in the art is obviously within the scope of the present invention. Also, in order to make the explanation clear, a width, a thickness, a shape, and others of each portion in the drawings are schematically illustrated more than those in an actual aspect in some cases. However, the illustration is only an example, and does not limit the interpretation of the present invention. In the present specification and each drawing, similar elements to those described earlier for the already-described drawings are denoted with the same or similar reference characters, and detailed description for them is appropriately omitted in some cases.

In the following embodiments, a microLED display apparatus including a plurality of microLED elements will be exemplified and explained as an example of the display apparatus using the plurality of inorganic light emitting elements. The microLED element has a merit capable of displaying high-definition images because of having a smaller element size (outer shape dimension) than that of a general LED element.

Note that an Organic Light-Emitting Diode (OLED) is exemplified as the light emitting diode element that is the self-luminous element. The inorganic light emitting diode (microLED element) explained in the following embodiment is distinguished from the organic light emitting diode. A display apparatus using the inorganic light emitting diode element has higher reliability as the LED element than a display apparatus using the organic light emitting diode element, and therefore, has been expected to be used for a case requiring high luminance.

Display Apparatus

Figure 2:
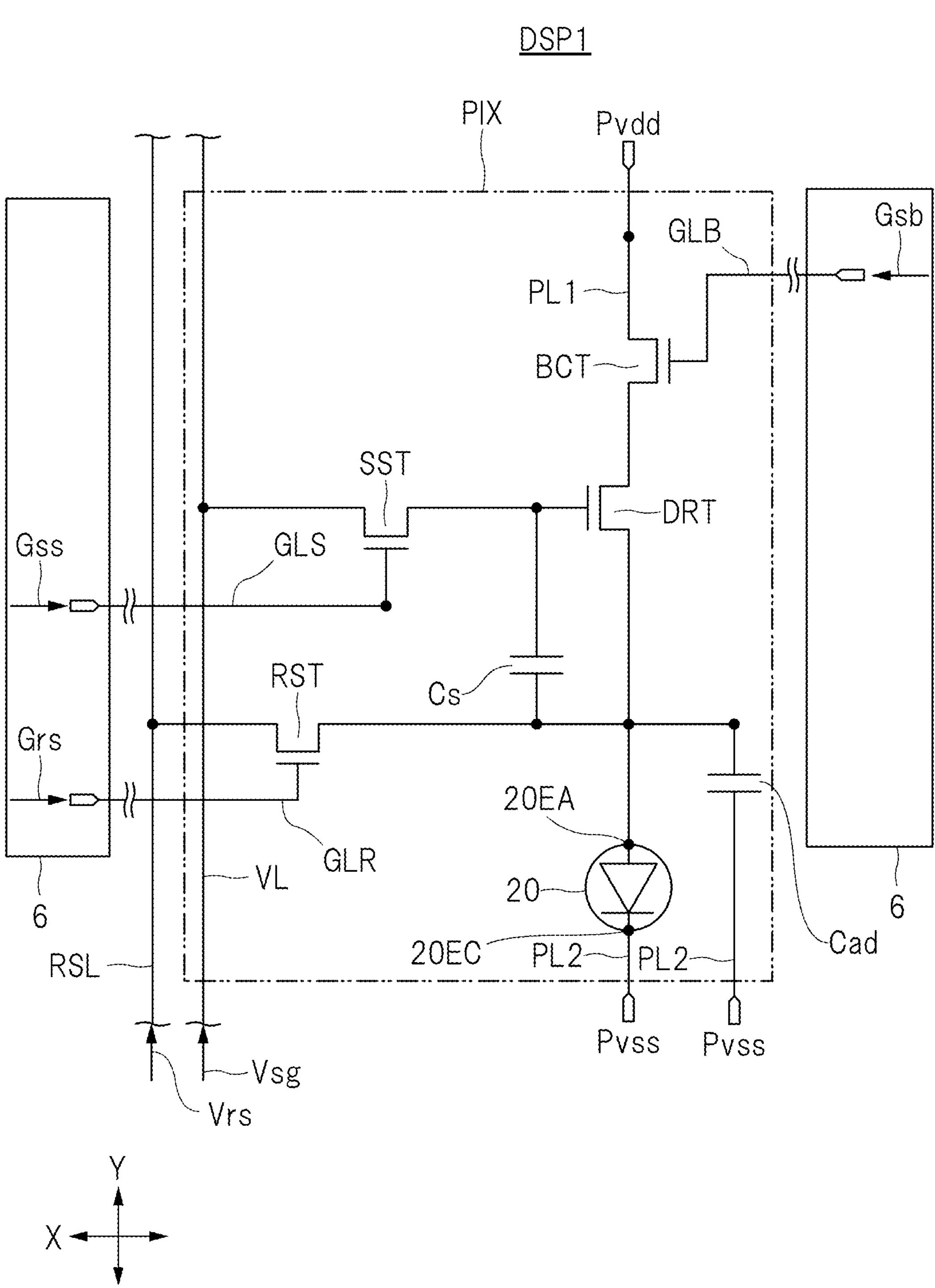
FIG. 2 is a circuit diagram showing a configuration example of a circuit around a pixel shown in FIG. 1.

First, a configuration example of a microLED display apparatus that is the display apparatus of the present embodiment will be described. FIG. 1 is a plan view showing a configuration example of the display apparatus according to an embodiment. In FIG. 1, each of a boundary between a display region DA and a peripheral region PFA, a control circuit 5, a drive circuit 6, and a plurality of pixels PIX is shown with a dashed double-dotted line. FIG. 2 is a circuit diagram showing a configuration example of a circuit around the pixel shown in FIG. 1. Note that a pixel circuit PC shown in FIG. 2 is illustrated as an example of an equivalent circuit corresponding to one pixel PIX shown in FIG. 1.

FIG. 1 shows an X direction and a Y direction. The X direction and the Y direction cross each other. In an example explained below, the X direction is orthogonal to the Y direction. An X-Y plane including the X direction and the Y direction will be explained below as a plane parallel to a display surface of the display apparatus. In the following explanation, a term "plan view" means viewing of a plane parallel to the X-Y plane unless otherwise particularly stated that the term is to be interpreted in different meaning. Also, as described later, a normal-line direction to the X-Y plane will be explained as a "Z direction" or a thickness direction. The X direction, the Y direction and the Z direction cross one another, more specifically are orthogonal to one another.

As shown in FIG. 1, a display apparatus DSP1 of the present embodiment includes the display region DA, the peripheral region PFA surrounding the display region DA in a frame form, and the plurality of pixels PIX arranged in a matrix form within the display region DA. The display apparatus DSP1 also includes a substrate 10, the control circuit 5 formed on the substrate 10, and the drive circuit 6 formed on the substrate 10.

The control circuit 5 is a control circuit that controls driving of a displaying function of the display apparatus DSP1. For example, the control circuit 5 is a driver IC (integrated circuit) mounted on the substrate 10. In the example shown in FIG. 1, the control circuit 5 is placed along one short side among four sides of the substrate 10. In an example of the present embodiment, the control circuit 5 includes a signal line drive circuit (video driver) that drives video signal lines VL (see FIG. 2) connected to the plurality of pixels PIX. However, the position and configuration example of the control circuit 5 are not limited to the example shown in FIG. 1, but there are various modification examples thereof. For example, in FIG. 1, a circuit board such as a flexible printed board may be connected to the position shown as the control circuit 5, and the above-described driver IC may be mounted on the circuit board. In addition, for example, the signal line drive circuit that drives the video signal lines VL may be formed separately from the control circuit 5.

The drive circuit (scan driver) 6 is a circuit that drives a scan signal line GL among the plurality of pixels PIX. The drive circuit 6 drives the plurality of scan signal lines GL based on a control signal from the control circuit 5. In the example shown in FIG. 1, the drive circuit 6 is arranged along each of two long sides among four sides of the substrate 10. In the example shown in FIG. 1, the display region DA is arranged between two drive circuit 6 in plan view. However, the position and configuration example of the drive circuit 6 are not limited to the example shown in FIG. 1, but there are various modification examples thereof. For example, in FIG. 1, a circuit board such as a flexible printed board may be connected to the position shown as the control circuit 5, and the above-described drive circuit 6 may be mounted on the circuit board.

Next, a configuration example of the pixel circuit PC for driving the pixel PIX shown in FIG. 1 will be described with reference to FIG. 2. Note that one pixel circuit PC for driving one pixel PIX is exemplified as a representative example and illustrated in FIG. 2. Each of the plurality of pixels PIX shown in FIG. 1 includes the same circuit as the pixel circuit PC shown in FIG. 2. The pixel circuit PC is a voltage signal type circuit that controls a light emitting state of an LED element 20 in accordance with a video signal Vsg supplied from the control circuit 5 (see FIG. 1).

As shown in FIG. 2, the pixel PIX includes the LED element 20. The LED element 20 is the micro light-emitting diode described above. The LED element 20 includes an anode electrode 20EA and a cathode electrode 20EC.

The display region DA of the display apparatus DSP1 includes a plurality of types of wirings. These wirings include a plurality of scan signal lines GLS, GLR and GLB, a plurality of video signal lines VL, a plurality of power supply lines PL1, a plurality of power supply lines PL2 and a plurality of reset wirings RSL.

The scan signal lines GLS, GLR and GLB extend in the X direction, and are connected to the drive circuit 6. For example, as shown in FIG. 1, the scan signal lines GLS, GLR and GLB for driving the even-numbered pixel PIX of the pixels PIX arranged in the Y direction are connected to one of the drive circuits 6 while the scan signal lines GLS, GLR and GLB for driving the odd-numbered pixel PIX are connected to the other of the drive circuits 6. As another example, for example, any of the scan signal lines GLS, GLR and GLB may be connected to one of the drive circuits 6 while the rest of the scan signal lines GLS, GLR and GLB may be connected to the other of the drive circuits 6, such that all the scan signal lines GLS and GLR are connected to one of the drive circuits 6 while all the scan signal lines GLB are connected to the other of the drive circuits 6.

The video signal lines VL, the power supply lines PL1 and PL2 and the reset wiring RSL extend in the Y direction. The video signal line VL is connected to the control circuit 5 (see FIG. 1). A video signal Vsg and an initialization signal are supplied from the control circuit 5 to the video signal line VL. A high potential Pvdd is supplied from the control circuit 5 to the power supply line PL1. A low potential Puss lower than the high potential Pvdd is supplied from the control circuit 5 to the power supply line PL2. A rest signal Vrs is supplied from the control circuit 5 to the reset wiring RSL.

The control circuit 5 outputs a start pulse signal or a clock signal not illustrated to the drive circuit 6. The drive circuit 6 includes a plurality of shift register circuits, sequentially transfers the start pulse signal to a shift register circuit of a next stage in response to the clock signal, and sequentially supplies the scan signal to each of the scan signal lines GLS, GLR and GLB.

The pixel circuit PC controls the LED element 20 in response to the video signal Vsg supplied to the video signal line VL. In order to achieve such control, the pixel circuit PC according to the present embodiment includes a rest transistor (switching element) RST, a pixel selection transistor (switching element) SST, an output transistor (switching element) BCT, a drive transistor (switching element) DRT, a holding capacitance Cs and an auxiliary capacitance Cad. The auxiliary capacitance Cad is an element for adjusting a light emitting current volume, and may be unnecessary depending on cases.

Each of the rest transistor RST, the pixel selection transistor SST, the output transistor BCT and the drive transistor DRT is a switching element made of a Thin Film Transistor (TFT). A conductivity type of the thin film transistor is not particularly limited. For example, each of all transistors may be made of an N-channel type TFT, or at least one of these transistors may be made of a P-channel type TFT.

In the present embodiment, the rest transistor RST, the pixel selection transistor SST, the output transistor BCT and the drive transistor DRT are formed by the same step to have the same layer structure as one another, and have a bottom gate structure in which polycrystal silicon is used for a semiconductor layer. As another example, the rest transistor RST, the pixel selection transistor SST, the output transistor BCT and the drive transistor DRT may have a top gate structure. Note that oxide semiconductor, polycrystal GaN semiconductor or others may be used for the semiconductor layer.

Each of the rest transistor RST, the pixel selection transistor SST, the output transistor BCT and the drive transistor DRT includes a source electrode, a drain electrode and a gate electrode. The gate electrode included in each transistor is also referred to as control electrode. The source electrode and the drain electrode included in each transistor is simply referred to as electrode.

The drive transistor DRT and the output transistor BCT are connected to the LED element 20 in series between the power supply lines PL1 and PL2. The high potential Pvdd supplied to the power supply line PL1 is set to, for example, 10 V, and the low potential Pvss supplied to the power supply line PL2 is set to, for example, 1.5 V.

The drain electrode of the output transistor BCT is connected to the power supply line PL1. The source electrode of the output transistor BCT is connected to the drain electrode of the drive transistor DRT. The gate electrode of the output transistor BCT is connected to the scan signal line GLB. The output transistor BCT is turned ON/OFF by a control signal Gsb supplied to the scan signal line GLB. In this case, "ON" represents an electrical connection state, and "OFF" represents an electrical disconnection state. The output transistor BCT controls light emitting time of the LED element 20, based on the control signal Gsb.

The source electrode of the drive transistor DRT is connected to one electrode (in this case, a positive electrode) of the LED element 20. The other electrode (in this case, a negative electrode) of the LED element 20 is connected to the power supply line PL2. The drive transistor DRT outputs a drive electric current depending on the video signal Vsg to the LED element 20.

The source electrode of the pixel selection transistor SST is connected to the video signal line VL. The drain electrode of the pixel selection transistor SST is connected to the gate electrode of the drive transistor DRT. The gate electrode of the pixel selection transistor SST is connected to the scan signal line GLS functioning as a gate wiring for signal writing control. The pixel selection transistor SST is turned ON/OFF by a control signal Gss supplied from the scan signal line GLS to switch a state between the pixel circuit PC and the video signal line VL to a connection state or a disconnection state. In other words, when the pixel selection transistor SST is turned ON, the video signal Vsg of the video signal line VL or the initialization signal is supplied to the gate electrode of the drive transistor DRT.

The source electrode of the reset transistor RST is connected to the reset wiring RSL. The drain electrode of the reset transistor RST is connected to the source electrode of the drive transistor DRT and the positive electrode of the LED element 20. The gate electrode of the reset transistor RST is connected to the scan signal line GLR functioning as a gate wiring for rest control. The reset transistor RST is turned ON/OFF by a control signal Grs supplied from the scan signal line GLR. When the reset transistor RST is turned ON, potentials of the source electrode of the drive transistor DRT and the positive electrode of the LED element 20 can be reset by a reset signal Vrs of the reset wiring RSL. In other words, the reset wiring RSL is a wiring for resetting the voltage of the LED element 20.

The holding capacitance Cs is connected between the gate electrode and the source electrode of the drive transistor r DRT. The auxiliary capacitance Cad is connected between the source electrode of the drive transistor DRT and the power source line PL2.

The drive circuit 6 sequentially supplies the control signals Gss, Grs and Gsb to the scan signal lines GLS, GLR and GLB of each line (a series of pixels PIX in the X direction), based on the start pulse signal and the clock signal. The control circuit 5 sequentially supplies the video signal Vsg and the initialization signal to each video signal line VL, based on the signal supplied from the control circuit 5 shown in FIG. 2. The electric charge held in the holding capacitance Cs by the supply of the video signal Vsg is initialized by the supply of the initialization signal.

In such a configuration described above, the pixel circuit PC is driven by the control signals Gss, Grs and Gsb supplied to the scan signal lines GLS, GLR and GLB, and the LED element 20 emits the light having a luminance depending on the video signal Vsg of the video signal line VL.

Peripheral Structure of LED Element

Figure 3:
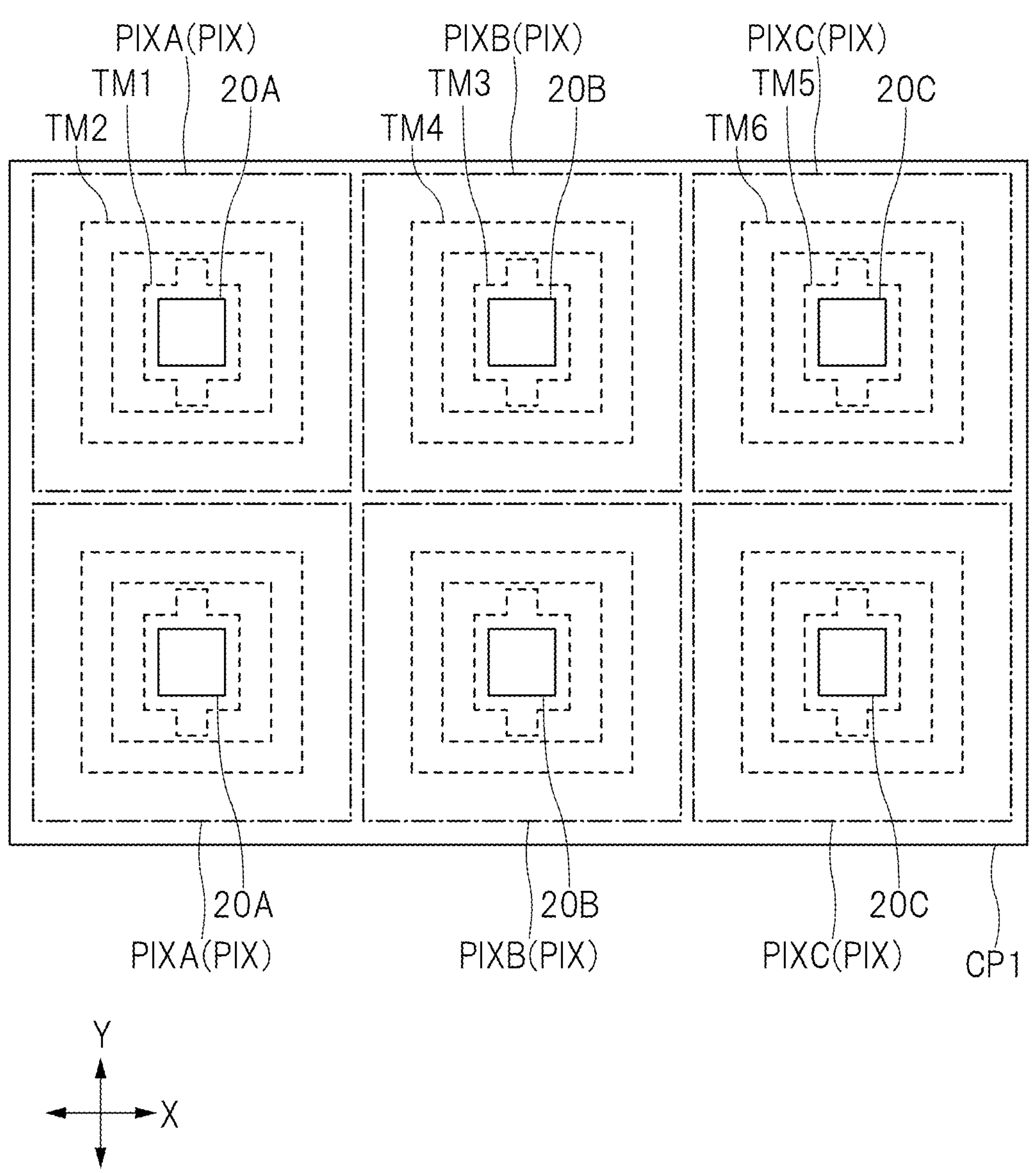
FIG. 3 is an enlarged transparent plan view showing an example of a peripheral structure of an LED element arranged in each of a plurality of pixels of the display apparatus shown in FIG. 1.
Figure 4:
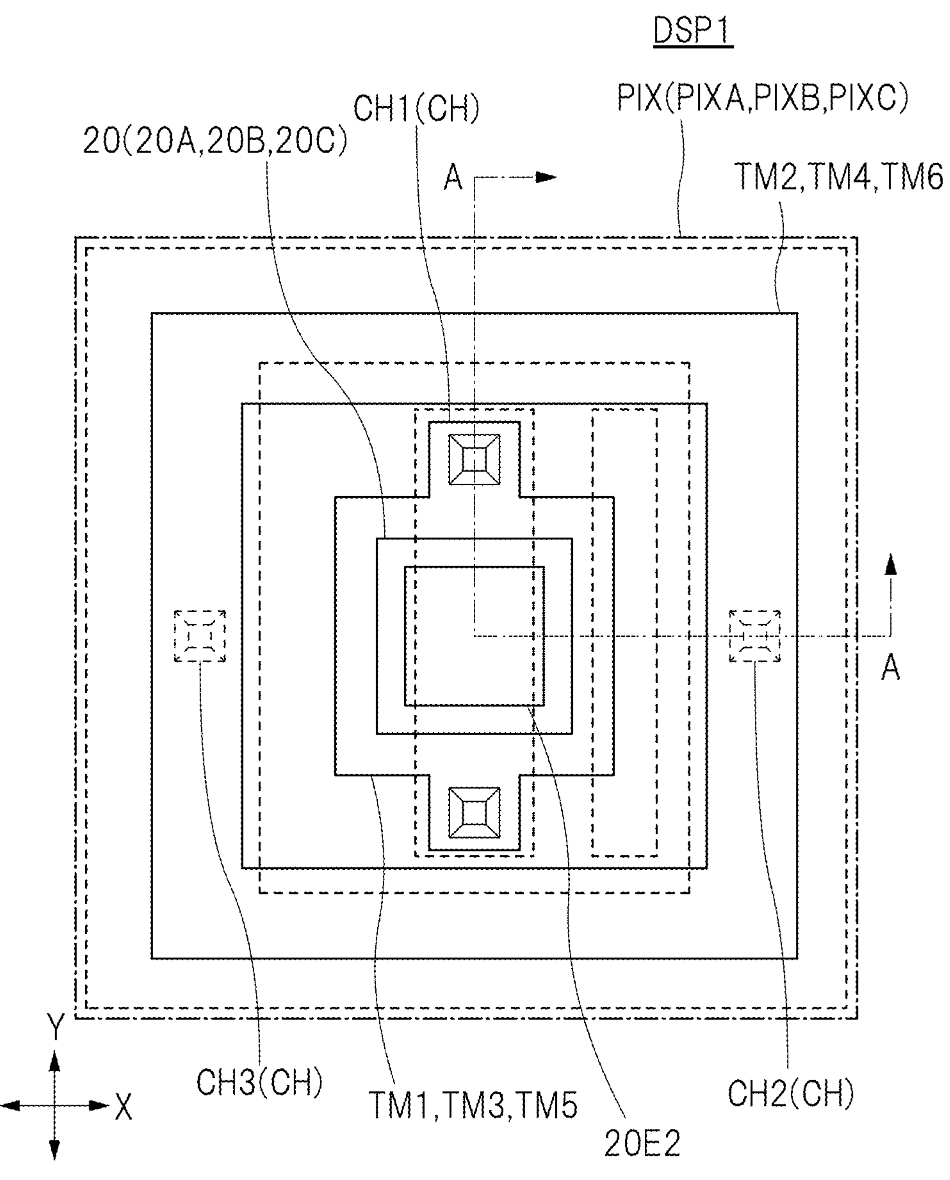
FIG. 4 is an enlarged transparent plan view showing one of three pixels (subpixels) shown in FIG. 3 to be further enlarged.
Figure 5:
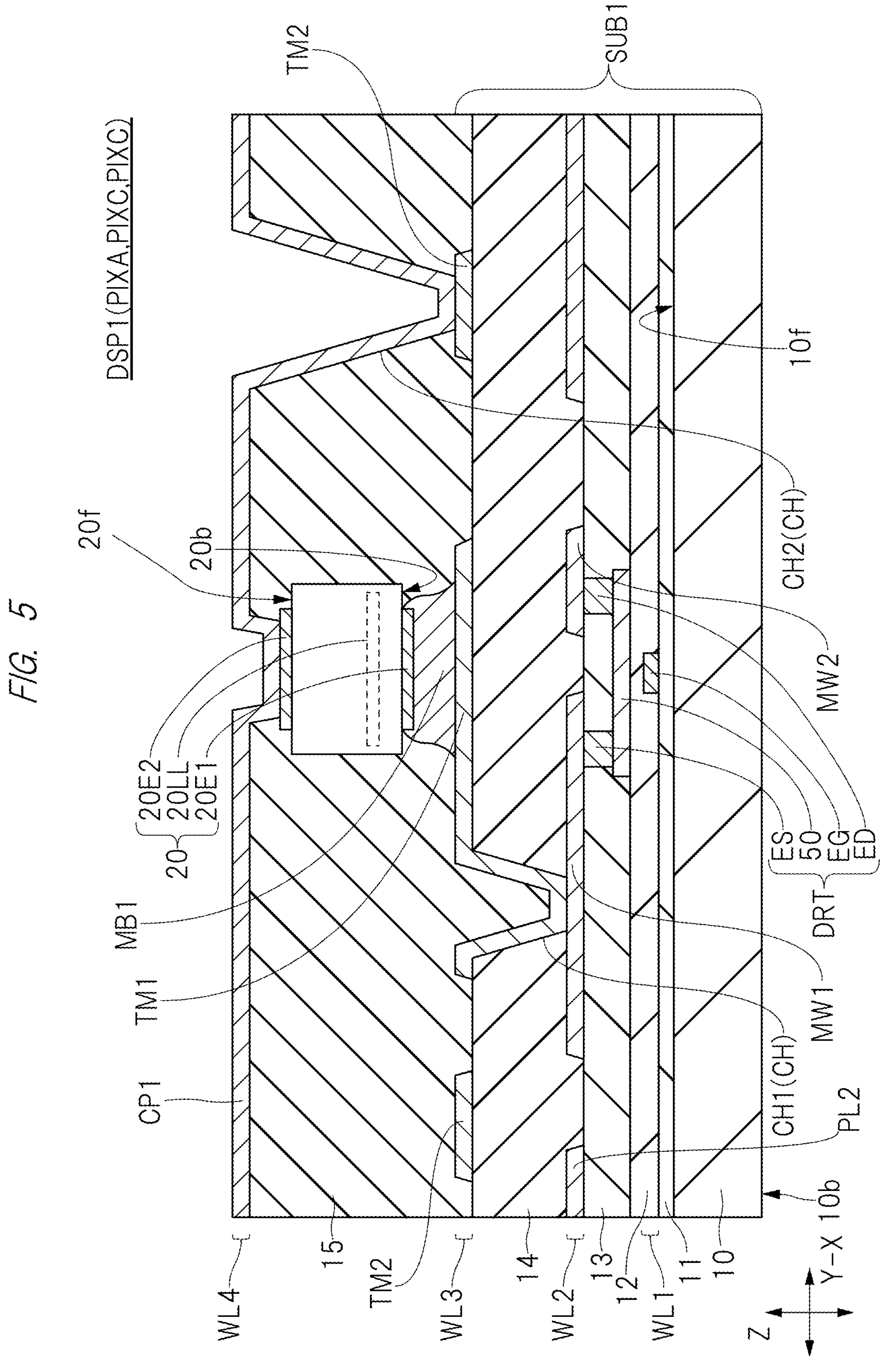
FIG. 5 is an enlarged cross-sectional view taken along a line A-A in FIG. 4.

Next, a peripheral structure of the LED element arranged in the pixel PIX shown in FIG. 1 will be explained. FIG. 3 is an enlarged transparent plan view showing an example of the peripheral structure of the LED element arranged in each of the plurality of pixels of the display apparatus shown in FIG. 1. FIG. 4 is an enlarged transparent plan view showing one of the plurality of pixels (subpixels) shown in FIG. 3 to be further enlarged. FIG. 5 is an enlarged cross-sectional view taken along a line A-A of FIG. 4. In FIG. 3, the LED element 20 and the conductor pattern CP1 are illustrated with a solid line, and the conductor pattern in the wiring layer WL3 shown in FIG. 5 is illustrated with a dotted line. In FIG. 4, the LED element 20 and the conductor pattern in the wiring layer WL3 shown in FIG. 5 are illustrated with a solid line, and the conductor pattern in the wiring layer WL2 and a contact hole electrically connecting the wiring layer WL3 and the wiring layer WL4 are illustrated with a dotted line. A pixel PIXA, a pixel PIXB and a pixel PIXC shown in FIG. 3 have the same structure as one another. Therefore, FIGS. 4 and 5 show a structure of one pixel PIX (see FIG. 4) as a representative example, and a symbol corresponding to each of the pixel PIXA, the pixel PIXB and the pixel PIXC is added.

The pixel circuit PC shown in FIG. 2 is the circuit corresponding to each of the pixel PIXA, the pixel PIXB and the pixel PIXC shown in FIG. 3. Therefore, each of the pixel PIXA, the pixel PIXB, and the pixel PIXC shown in FIG. 3 includes the reset transistor RST, the pixel selection transistor SST, the output transistor BCT, and the drive transistor DRT as described with reference to FIG. 2. Similarly, each of the pixel PIXA, the pixel PIXB and the pixel PIXC shown in FIG. 3 includes the holding capacitance Cs and the auxiliary capacitance Cad described with reference to FIG. 2.

The display apparatus DSP1 includes a substrate structure SUB1 with a plurality of wiring layers stacked on the substrate 10 (see FIG. 5) and a plurality of LED elements (inorganic light emitting diode elements) 20 mounted on the substrate structure SUB1. The display apparatus DSP1 displays images by driving each of the plurality of LED elements 20 mounted on the substrate structure SUB1.

The substrate 10 shown in FIG. 5 has a surface 10*f* and a surface 10*b* opposite to the surface 10*f*. A plurality of wiring layers and a plurality of insulating layers are stacked on the surface 10*f* of the substrate 10. The substrate 10 is, for example, a glass substrate made of glass. However, there are various modification examples of a material configuring the substrate 10. For example, a resin substrate made of resin may be used.

In the example shown in FIG. 5, the plurality of wiring layers included in the display apparatus DSP1 include a wiring layer WL4, a wiring layer WL3, a wiring layer WL2 and a wiring layer WL1, which are stacked in this order from the wiring layer WL4 to the substrate 10. The plurality of insulating layers included in the display apparatus DSP1 include insulating layers 11, 12, 13, 14, and 15, which are stacked in this order from the surface 10*f* of the substrate 10.

The insulating layer 11 is a base layer of the thin-film transistor, and is an inorganic insulating layer made of an inorganic material. The wiring layer WL1 is placed on the insulating layer 11, and is covered with the insulating layer 12. The conductor pattern formed in the wiring layer WL1 includes the gate electrode EG shown in FIG. 5 and the scan signal lines GLB, GLS, and GLR described with reference to FIG. 2. The insulating layer 12 is also an inorganic insulating layer made of an inorganic material. A portion of the insulating layer 12, the portion being arranged between the gate electrode EG of the transistor and the semiconductor layer 50, functions as a gate insulating film.

The drive transistor DRT including the gate electrode EG includes the semiconductor layer 50, the gate electrode EG, the source electrode ES, and the drain electrode ED. In the example shown in FIG. 5, the thin-film transistor with the bottom gate structure is shown as an example. However, the top gate structure may be used as a modification example. The gate electrode EG is arranged on the insulating layer 11. The semiconductor layer 50 is arranged on the insulating layer 12. One portion of the semiconductor layer 50 corresponds to a source region, and the source electrode ES is connected to the source region. The other portion of the semiconductor layer 50 corresponds to a drain region, and the drain electrode ED is connected to the drain region. A region between the source region and the drain region functions as a channel region.

The wiring layer WL2 is arranged on the insulating layer 13 covering the drive transistor DRT. The insulating layer 13 is an inorganic insulating layer made of an inorganic material. The conductor pattern formed in the wiring layer WL2 includes a wiring connected to each of the plurality of transistors. For example, as shown in FIG. 5, a wiring pattern MW1 connected to the source electrode ES of the drive transistor DRT and a wiring pattern MW2 connected to the drain electrode ED of the drive transistor DRT are included in the wiring layer WL2. The conductor patterns formed in the wiring layer WL2 include the video signal line VL, the power supply line PL1, the power supply line PL2, and the reset wiring RSL shown in FIG. 2.

Each of the insulating layer 14 covering the wiring layer WL2 and the insulating layer 15 stacked on the insulating layer 14 is an organic insulating film made of an organic material. The insulating layer 14 is an insulating layer positioned between the wiring layer WL2 and the wiring layer WL3. The insulating layer 15 is an insulating layer arranged between the wiring layer WL3 and the wiring layer WL4. As shown in FIG. 5, the contact hole CH is used for electrical connection between the wiring layer WL2 and the wiring layer WL3 and between the wiring layer WL3 and the wiring layer WL4. The organic insulating layer has superior embedding property for an opening (such as the contact hole) to that of the inorganic insulating layer. In other words, in the case of the organic insulating layer, even when the base member has the opening, the top surface is easy to be flattened. Therefore, each of the insulating layer 14 and the insulating layer 15 including a lot of contact holes CH formed therein is made of the organic material. The LED element 20 is sealed by the insulating layer 15. In other words, the insulating layer 15 is used as a sealing member to seal the LED element 20. When an organic material is used for the insulating layer 15 as the sealing member, it is difficult to form a gap between the LED element 20 and the insulating layer 15, and therefore, the sealing property can be improved.

The wiring layer WL3 is arranged on the insulating layer 14. The conductor pattern formed in the wiring layer WL2 includes a terminal TM1 connected to the electrode 20E1 of the LED element 20 and a terminal TM2 connected to the electrode 20E2 of the LED element 20. More specifically, a bump electrode MB1 is formed between the terminal TM1 and the electrode 20E1 of the LED element 20, and the terminal TM1 is electrically connected to the electrode 20E1 through the bump electrode MB1. The bump electrode MB1 is made of, for example, a stacked metallic film. As an example of the bump electrode MB1, a stacked film made of a copper film, a nickel film, and a tin film in this order from the terminal TM1 side can be exemplified.

The terminal TM1 is made of metal, and is electrically connected to the wiring pattern MW1 of the wiring layer WL2 through the contact hole CH1 formed in the insulating layer 14. The terminal TM2 is made of metal, and is electrically connected to the power line PL2 of the wiring layer WL2 through the contact hole CH3 (see FIG. 4) formed in the insulating layer 14.

The conductor pattern formed in each of the wiring layer WL1, the wiring layer WL2, and the wiring layer WL3 is a metal pattern made of metal. For example, a TAT film made of a stacked film of a titanium film, an aluminum film and a titanium film in this order from a bottom layer, or a stacked film of a titanium film and an aluminum film, etc., can be exemplified as one example of the metal pattern.

The wiring layer WL4 is arranged on the insulating layer 15. The wiring layer WL4 includes a conductor pattern CP1 electrically connected to each of the electrode 20E2 of the LED element 20 and the terminal TM2. The conductor pattern CP1 is electrically connected to the terminal TM2 through the contact hole CH2 formed in the insulating layer 15.

The wiring layer WL4 is the topmost wiring layer among the plurality of wiring layers. Since the wiring layer WL4 is closer to the front side (display side) than the LED element 20, the conductor pattern CP1 formed in wiring layer WL2 is required to have visible-light transmittance. Therefore, the conductor pattern CP1 is made of a so-called transparent conductive material with visible light transparency. For example, ITO (Indium Tin Oxide) can be exemplified as the transparent conductive material. The light emitted from the LED element 20 is preferably suppressed to refract or scatter at a pattern end of the conductor pattern CP. Therefore, the conductor pattern CP1 is formed to cover at least the entire LED element 20. In each of the plurality of pixels PIX (see FIG. 1), it is preferable that the conductor pattern CP1 is formed to cover the entire insulating layer 15. It is particularly preferable that the conductor pattern CP1 is formed over the plurality of pixels PIX.

As shown in FIG. 3, the display apparatus DSP1 includes a plurality of LED elements 20. FIG. 3 shows an LED element 20A, an LED element 20B next to the LED element 20A, and an LED element 20C next to the LED element 20B among the plurality of LED elements 20 included in the display apparatus.

Each of the plurality of LED elements 20 includes an electrode 20E1 arranged on a surface 20*b* and an electrode 20E2 arranged on a surface 20*f* opposite to the surface 20*b* as shown in FIG. 5. An electrode 20E1 shown in FIG. 5 is, for example, the anode electrode 20EA shown in FIG. 2. An electrode 20E2 shown in FIG. 5 is, for example, the cathode electrode 20EC shown in FIG. 2. The LED element 20 includes a light-emitting layer 20LL between the surfaces 20*f* and 20*b*. The light generated in the light-emitting layer 20LL is emitted in all directions around the light-emitting layer 20LL.

The LED element 20 is mounted on the wiring layer WL3 of the plurality of wiring layers. The substrate structure SUB1 of the display apparatus DSP1 includes the transistor functioning as the switching element. FIG. 5 shows the drive transistor DRT as an example of the switching element arranged on the substrate 10. However, on the substrate 10 (more specifically, on the insulating layer 11), each of the reset transistor RST, the pixel selection transistor SST, the output transistor BCT, and the drive transistor DRT described with reference to FIG. 2 is located. Each of the reset transistor RST, the pixel selection transistor SST, the output transistor BCT, and the drive transistor DRT shown in FIG. 2 has the same structure as that of the drive transistor DRT shown in FIG. 5.

As described above, the display apparatus DSP1 includes the terminal TM1 electrically connected to the electrode 20E1, the terminal TM2 electrically connected to the electrode 20E2, the insulating layer 15 covering the terminal TM1, the LED element 20 and the terminal TM2, and the conductor pattern CP1 arranged on the insulating layer 15 and electrically connected to each of the electrode 20E2 of the LED element 20 and the terminal TM2.

Figure 6:
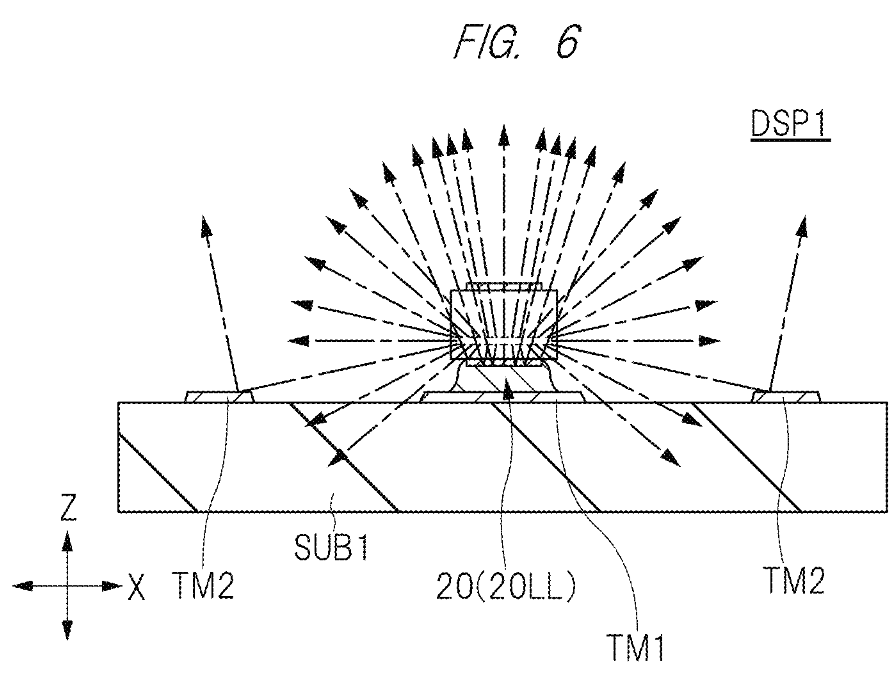
FIG. 6 is an enlarged cross-sectional view schematically showing a travelling direction of light emitted from an LED element shown in FIG. 5.

FIG. 6 is an enlarged cross-sectional view schematically showing a travel direction of the light emitted from the LED element shown in FIG. 5. FIG. 6 does not show illustration of each layer between the wiring layer WL3 shown in FIG. 5 and the substrate 10, and simply shows the substrate structure SUB1.

As shown in FIG. 6, the light formed in the light-emitting layer 20LL of the LED element 20 is emitted in all directions around the light-emitting layer 20LL. Therefore, in order to improve the luminance of the display apparatus DSP1, the light emitted from the LED element 20 toward the substrate structure SUB1 is preferably reflected toward the display surface side. However, if a member dedicated to reflect the light is arranged, this becomes a cause of a decrease in a manufacturing efficiency.

In the present embodiment, as shown in FIG. 4, in plan view, the terminal TM1 is arranged at a position overlapping the electrode 20E1, and the terminal TM2 is arranged to continuously surround the LED element 20. In other words, in the present embodiment, since the shape of the terminal TM2 is devised to continuously surround the LED element 20, the terminal TM2 is used as a light reflecting member.

As shown in FIG. 6, the light emitted from the LED element 20 and emitted onto the terminal TM2 is reflected by the terminal TM2, and travels in a direction of being away from the substrate structure SUB1 (in other words, toward an observer of the display apparatus DSP1). Therefore, the light that contributes to the improvement of the luminance of the display apparatus DSP1 can be increased.

As shown in FIG. 4, the terminal TM2 is arranged to continuously surround the LED element 20. In other words, the terminal TM2 forms a frame shape (or ring shape) that is not divided in the middle. Therefore, in planar view, the light emitted from the LED element 20 in all directions is easily reflected by the terminal TM2.

As described above, according to the present embodiment, since the terminal TM2 is used as the visible-light reflecting member, the luminance (more specifically, front luminance) of the display apparatus DSP1 can be improved. Since the display apparatus DSP1 can structurally improve the luminance, the power consumption can be reduced. Since the display apparatus DSP1 can reduce the power consumption, an amount of heat generated by the LED element 20 is reduced. As a result, the occurrence of failures due to heat, etc., can be suppressed, and therefore, a product life can be extended.

The case of the method of using the terminal TM2 to reflect the light can more suppress the complexity of the manufacturing steps than the case of forming the member dedicated to reflect the light. This is because the step of forming the terminal in TM2 the method of manufacturing the display apparatus DSP1 is essential even without consideration f the visible-light reflection, and therefore, an additional manufacturing step is not required by change of the shape of the terminal TM2. Note that the terminal TM2 is made of the same material as the terminal TM1. Therefore, in the method of manufacturing the display apparatus DSP1, the terminal TM2 is formed together with the terminal TM1.

Incidentally, in the case of the terminal TM1, a unique potential is supplied for the plurality of pixels PIX. Therefore, if an area of the terminal TM1 is large, the limitation on the wiring layout in the wiring layer WL3 becomes large. Meanwhile, the terminal TM2 is a terminal connected to the cathode electrode 20EC of the LED element 20 shown in FIG. 2, and a common potential is supplied among the plurality of pixels PIX. Therefore, even when the terminal TM2 is arranged to surround the terminal TM1, it is difficult to cause the limitation on the wiring layout.

As shown in FIG. 3, the display apparatus DSP1 includes the LED element 20 for each of the plurality of pixels PIX. For example, the display apparatus DSP1 includes an LED element 20A mounted on the pixel PIXA, an LED element 20B mounted on the pixel PIXB, and an LED element 20C mounted on the pixel PIXC. Each of the LED elements 20A, 20B and 20C has a surface 20*f* and a surface 20*b* shown in FIG. 5. Each of the LED elements 20A, 20B and 20C includes an electrode 20E1 and an electrode 20E2 shown in FIG. 5.

The electrode 20E1 (see FIG. 5) of the LED element 20A is connected to the terminal TM1, and the electrode 20E2 (see FIG. 5) of the LED element 20A is connected to the terminal TM2 through the conductor pattern CP1 (see FIG. 5).

The electrode 20E1 (see FIG. 5) of the LED element 20B is connected to the terminal TM3, and the electrode 20E2 (see FIG. 5) of the LED element 20B is connected to the terminal TM4 through the conductor pattern CP1 (see FIG. 5).

The electrode 20E1 (see FIG. 5) of the LED element 20C is connected to the terminal TM5, and the electrode 20E2

(see FIG. 5) of the LED element 20C is connected to the terminal TM6 through the conductor pattern CP1 (see FIG. 5).

Although repetitive explanations are omitted, the terminals TM3 and TM5 shown in FIG. 3 correspond to the terminal TM1 described above, and have the same shape as that of the terminal TM1. The terminals TM4 and TM6 shown in FIG. 3 correspond to the terminal TM2 described above, and have the same shape as that of the terminal TM2.

As described above, in the conductor pattern CP1, the common potential is supplied among the plurality of pixels PIX. Therefore, the conductor pattern CP1 is connected to each of the terminals TM2, TM4, and TM6.

First Modification Example

Figure 7:
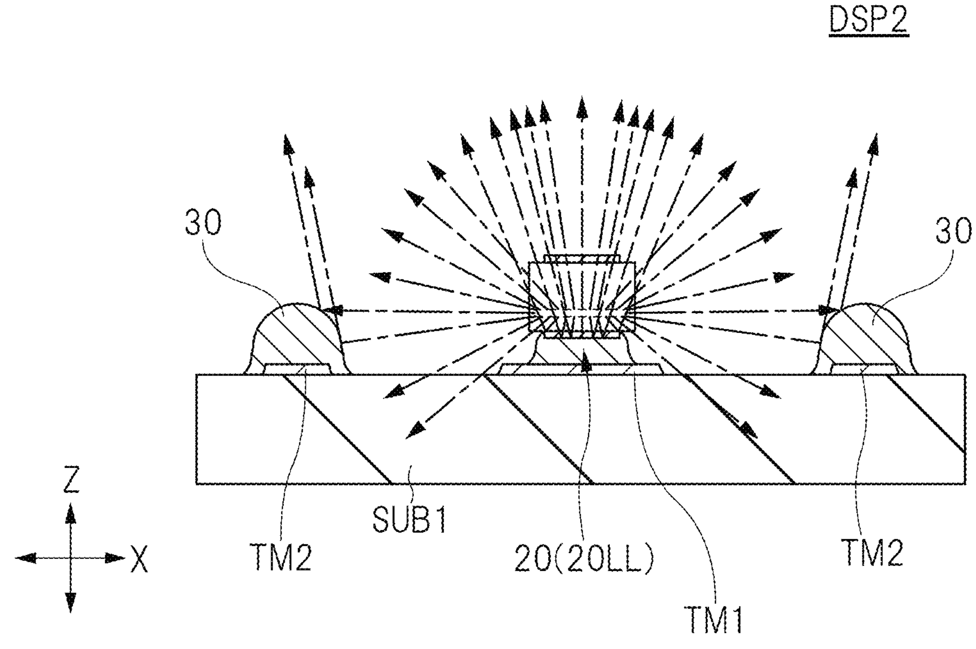
FIG. 7 is an enlarged cross-sectional view showing a modification example relative to FIG. 6.
Figure 8:
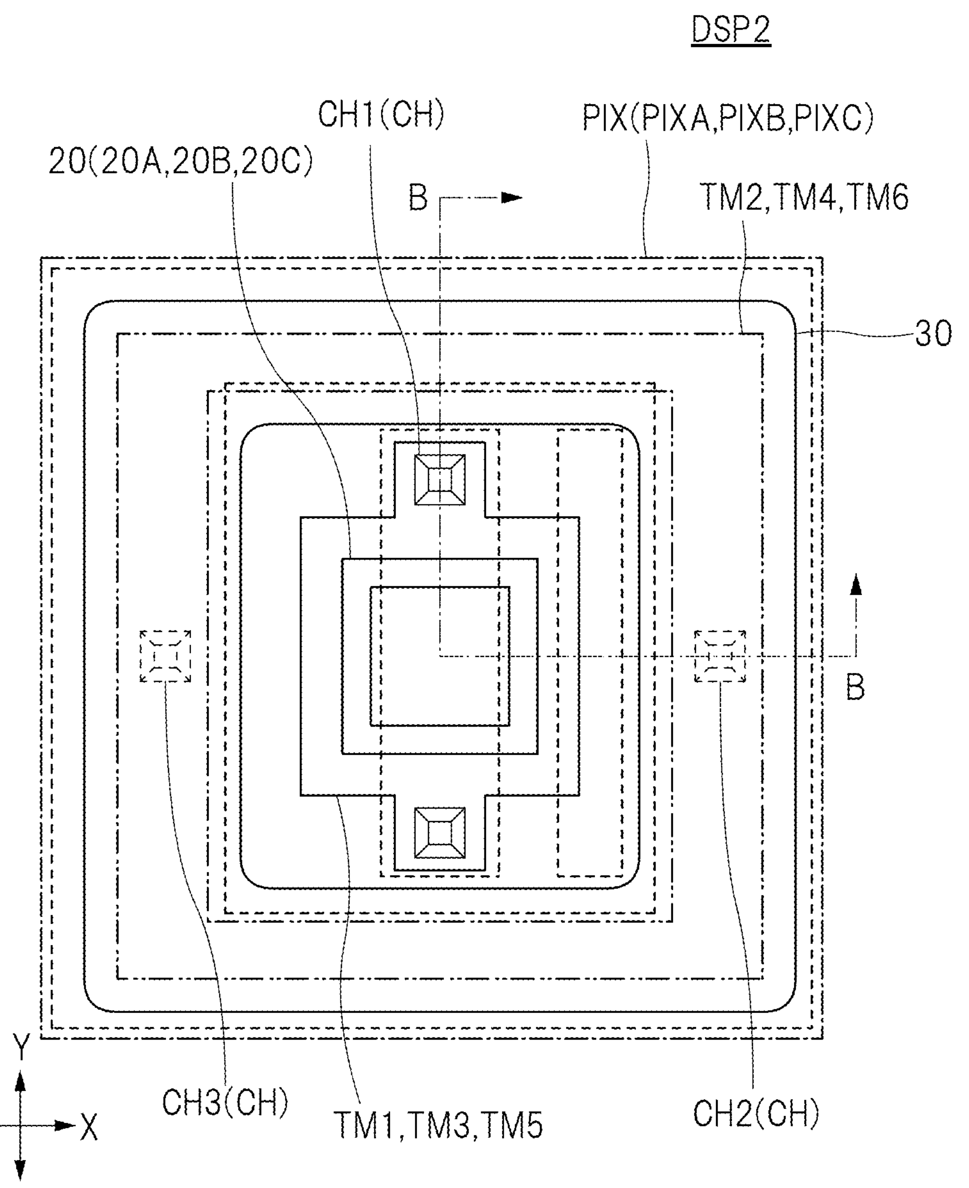
FIG. 8 is an enlarged transparent plan view of the display apparatus shown in FIG. 7.
Figure 9:
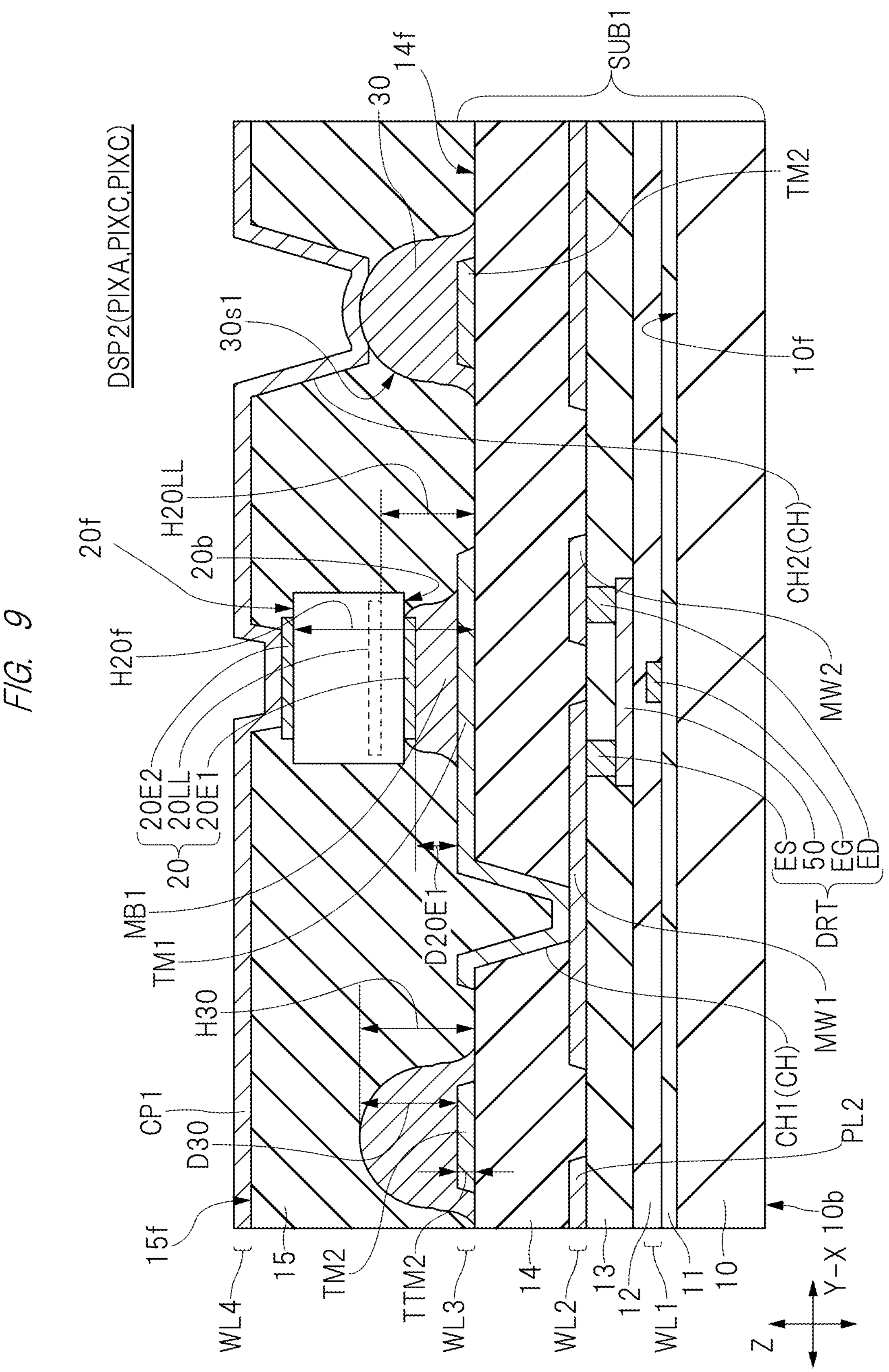
FIG. 9 is an enlarged cross-sectional view taken along a line B-B in FIG. 8.

Next, a modification example the display apparatus DSP1 described with reference to FIGS. 1 to 6 will be described. FIG. 7 is an enlarged cross-sectional view showing a modification example relative to FIG. 6. FIG. 8 is an enlarged transparent plan view of the display apparatus shown in FIG. 7. FIG. 9 is an enlarged cross-sectional view along a line B-B of FIG. 8. Note that FIG. 8 is a modification example corresponding to the enlarged plan view of FIG. 4, and FIG. 9 is a modification example corresponding to FIG. 5. In FIG. 7, in order to make it easy to distinguish between the terminals TM2, TM4 and the metal layer 30, each outline of the terminals TM2 and TM4 is illustrated with a dashed double-dotted line, and an outline of the metal layer 30 is illustrated with a solid line. Other members are illustrated with the same line types as those of FIG. 4.

A display apparatus DSP2 shown in FIGS. 7 to 9 differs in the following points from the display apparatus DSP1 shown in FIGS. 4 to 6. That is, the terminal TM2 included in the display apparatus DSP2 is covered with a metal layer 30. As shown in FIG. 8, in plan view, the metal layer 30 is arranged to continuously surround the LED element 20. When the terminal TM2 is covered with the metal layer 30 as shown in FIG. 7, the light emitted from the LED element 20 is reflected by the metal layer 30. An amount of the light emitted to the metal layer 30 included in the display apparatus DSP2 is larger than an amount of the light emitted to the terminal TM2 included in the display apparatus DSP1 shown in FIG. 6. As a result, the case of the display apparatus DSP2 provides the larger amount of the light that travels toward the observer of the display apparatus DSP2 than that of the case of the display apparatus DSP1 shown in FIG. 6, and therefore, the luminance can be improved.

The material configuring the metal layer 30 is not limited if at least the surface layer can reflect the visible light. As described later, in order to improve the manufacturing efficiency in the step of forming the metal layer 30, it is preferable that at least a part of the material configuring the bump electrode MB1 contains the same material as the material configuring the metal layer 30. In the case of the present embodiment, the metal layer 30 is made of, for example, nickel. As described above, the bump electrode MB1 is made of a stacked film made of a copper film, a nickel film and a tin film, in this order from the terminal TM1 side. Therefore, the material (such as nickel) configuring the metal layer 30 is contained in the material configuring the bump electrode MB1.

A reason why the nickel of copper, nickel and tin configuring the bump electrode MB1 is selected is that the nickel is a material that is more difficult to be oxidized than the copper and the tin. Since an oxide film is formed on the surface of the metal layer 30, the deterioration of the visible light reflection property of the surface of the metallic layer can be suppressed. In the case of the present embodiment, note that the metal layer 30 is a single nickel film, but may be, for example, a stacked film of a copper film and a nickel film in this order from the terminal TM2 side. If the copper film is not exposed from the surface layer of the metal layer 30, the copper film does not directly contribute to the visible-light reflection, and therefore, the entire copper film is preferably covered with the nickel film.

Incidentally, the metal layer 30 is particularly preferable to have the following structure. First, as shown in FIG. 9, the terminal TM2 is arranged on a surface 14*f* of the insulating layer 14. If the surface 14*f* of the insulating layer 14 is regarded as a reference plane, a height H30 of the top of the metal layer 30 from the reference plane (surface 14*f*) is larger than a height H20LL of the light-emitting layer 20LL of the LED element 20 from the reference plane (surface 14*f*). Since the height H30 is larger, the amount of light emitted onto the metal layer 30 can be increased. Particularly, as shown in FIG. 9, when the height H30 is larger than the height H20LL, light traveling horizontally (in a direction along the X-Y plane including the X and Y directions) from the light-emitting layer 20LL is securely emitted onto the metal layer 30.

The height of the top of the metal layer 30 shown in FIG. 9, in other words, a degree of a thickness of the metal layer 30, can be expressed as follows. That is, a distance D30 from the top of the metal layer 30 to the terminal TM2 is larger than a thickness TTM2 of the terminal TM2. Further, a structure of the metal layer 30 shown in FIG. 9 can be expressed as follows, with reference to a distance D20E1 from the electrode 20E1 of the LED element 20 to the terminal TM1. That is, the distance D30 from the top of the metal layer 30 to the terminal TM2 is larger than the distance D20E1 from the electrode 20E1 of the LED element 20 to the terminal TM1.

On the other hand, as shown in FIG. 9, the height H30 of the top of the metal layer 30 from the reference plane (surface 14F) is smaller than a height H20F of the surface 20F of the LED element 20 from the reference plane (surface 14F). As described above, the large height H30 of the top of the metal layer 30 increases the amount of light emitted onto the metal layer 30. However, the extremely large height H30 of the metal layer 30 possibly causes the following problems.

For example, the insulating layer 15 formed to cover the metal layer 30 has a surface 15*f* opposite to an interface with the insulating layer 14. In consideration of the ease of forming the conductor pattern CP1, the surface 15*f* is preferably a flat surface. Note that a portion of the contact hole CH2 is excluded. However, the extremely large height H30 of the metal layer 30 possibly locally loses the flatness of the surface 15*f*.

Therefore, as shown in FIG. 9, it is particularly preferred that the height H30 of the top of the metal layer 30 from the reference plane (surface 14*f*) is smaller than the height H20*f* of the surface 20*f* of the LED element 20 from the reference plane (surface 14*f*).

As shown in FIG. 9, the metal layer 30 has a side surface 30*s*1 facing the LED element 20 through the insulating layer 15. In the case of the example shown in FIG. 9, the boundary between the metal layer 30 and the insulating layer 14 has a dome shape, and therefore, a range of the side surface 30*s*1 can be defined as a region from a bottom end at which the metal layer 30, the insulating layer 14 and the insulating layer 15 intersect one another to the top of the metal layer 30. In the case of the example shown in FIG. 9, the side 30$s$1 has a curved surface.

When the side surface 30$s$1 of the metal layer 30 has the curved surface, light emitted onto the side surface 30$s$1 is easily reflected toward the observer of the display apparatus DSP2. As a result, the front luminance of the display apparatus DSP2 can be improved.

The display apparatus DSP2 shown in FIGS. 7 to 9 is similar to the display apparatus DSP1 described with reference to FIGS. 1 to 6, except for the differences described above. Therefore, duplicated description will be omitted.

Second Modification Example

Figure 10:
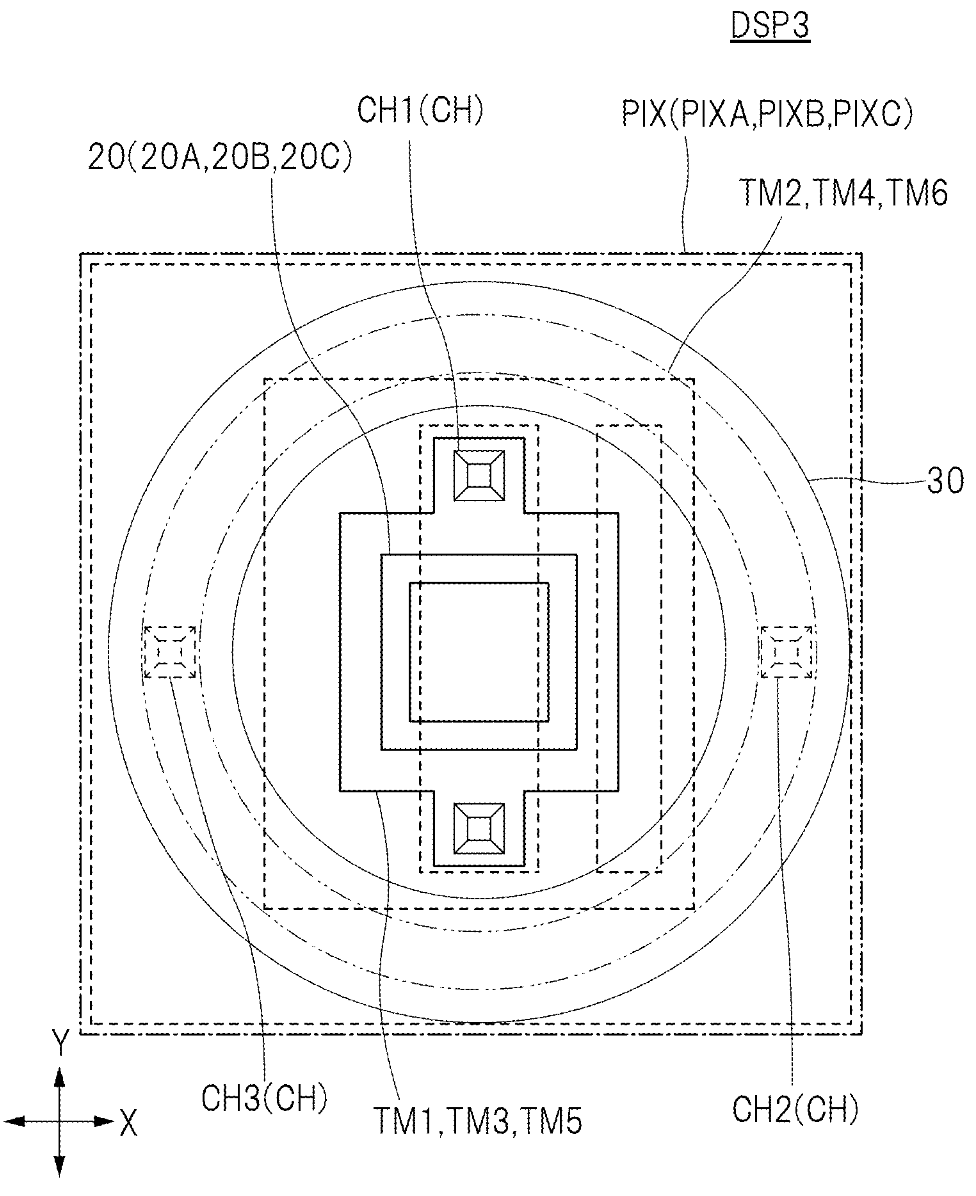
FIG. 10 is an enlarged transparent plan view showing a modification example relative to FIG. 8.

Next, a modification example of the display apparatus DSP2 described with reference to FIGS. 7 to 9 will be described. FIG. 10 is an enlarged transparent plan view showing a modification example relative to FIG. 8.

A display apparatus DSP3 shown in FIG. 10 differs from the display apparatus DSP2 shown in FIG. 8 in that the metal layer 30 has an annular shape in plan view. More specifically, each of the terminal TM2 and the metal layer 30 formed on the terminal TM2 in the display apparatus DSP3 has the annular shape in plan view.

The light emitted from the LED element 20 peripherally diffuses. Therefore, since the light is reflected by the metal layer 30 having the annular shape, unevenness of the luminance can be reduced. In addition, the metal layer 30 is formed to follow the shape of the terminal TM2. Therefore, since the terminal TM2 is formed to have the annular shape, the planar shape of the metal layer 30 can be easily formed to be the annular shape.

The display apparatus DSP3 shown in FIG. 10 is similar to the display apparatus DSP2 described with reference to FIGS. 7 to 9, except for the differences described above. Therefore, duplicated description will be omitted.

Third Modification Example

Figure 11:
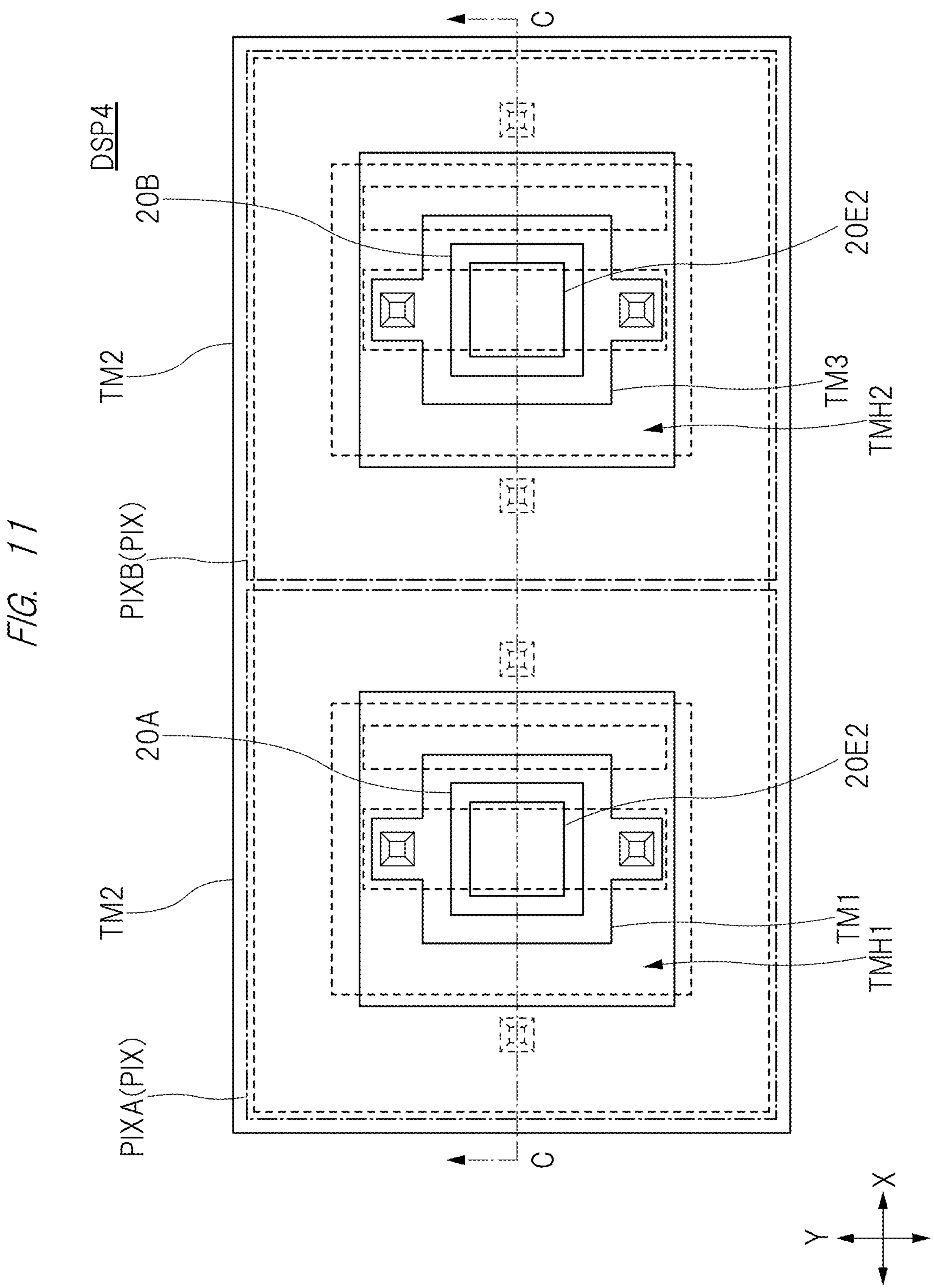
FIG. 11 is an enlarged transparent plan view showing a modification example relative to FIG. 4.
Figure 12:
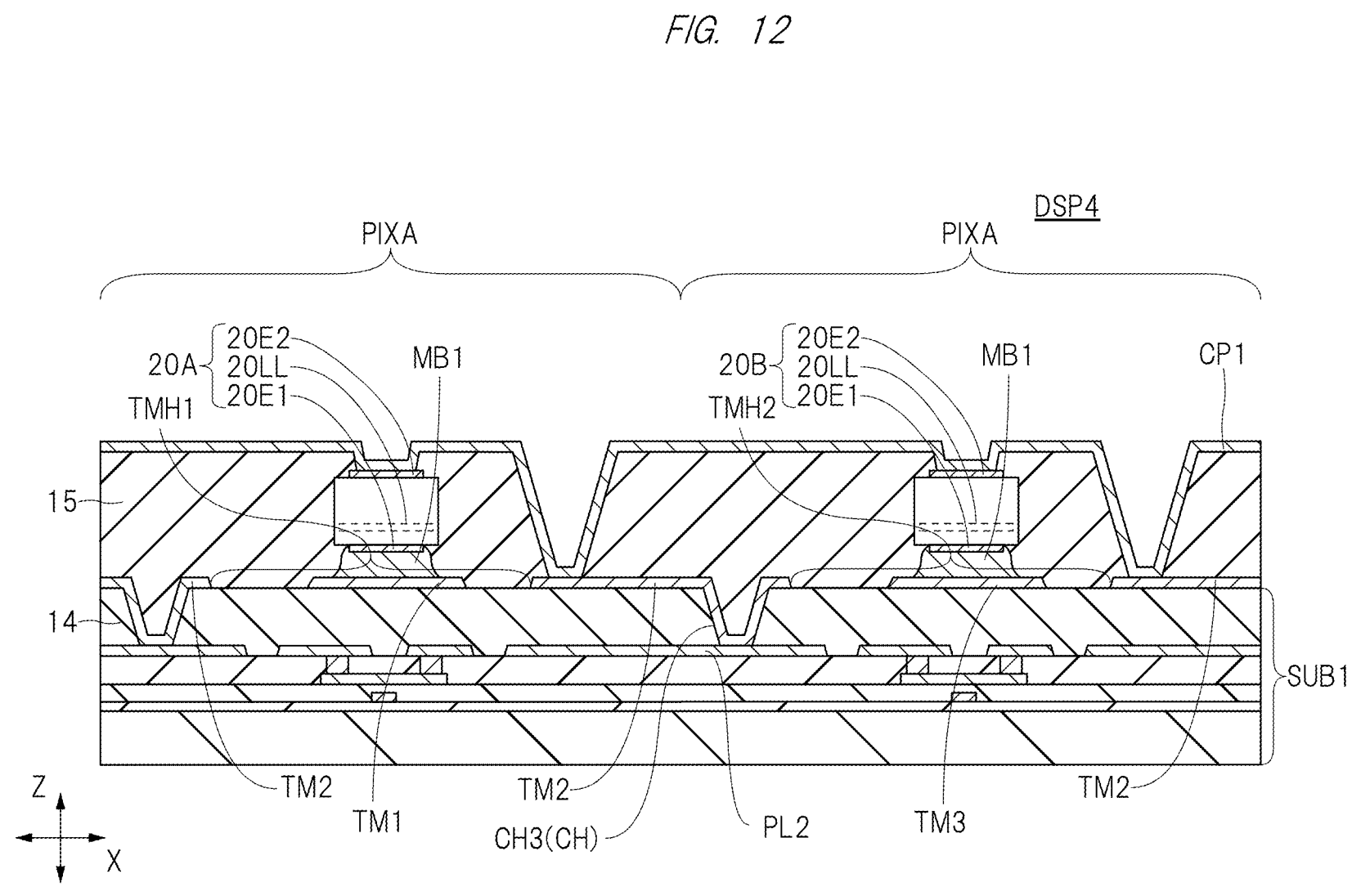

Next, another modification example of the display apparatus DSP1 described with reference to FIGS. 1 to 6 will be described. FIG. 11 is an enlarged transparent plan view showing a modification example relative to FIG. 4. FIG. 12 is an enlarged cross-sectional view taken along a line C-C of FIG. 11. As described above, an electrical potential that is common among the plurality of pixels PIX is supplied to the terminal TM2. Therefore, even if the terminals TM2 provided in the respective adjacent pixel PIXs are unified, no electrical problem arises. This modification example is an embodiment of a case in which the terminal TM2 is formed so as to straddle the plurality of pixels PIX.

A display apparatus DSP4 shown in FIGS. 11 and 12 includes an LED element 20A and an LED element 20B. Each of the LED element 20A and the LED element 20B has the surface 20$f$, the surface 20$b$, the electrode 20E1, the layer 20LL electrode 20E2, and the light-emitting described with reference to FIG. 5. The display apparatus DSP4 also includes a terminal TM3 electrically connected to the electrode 20E1 of the LED element 20B. The terminal TM2 is electrically connected to each of the electrode 20E2 of the LED element 20A and the electrode 20E2 of the LED element 20B. More specifically, the terminal TM2 is electrically connected to each of the electrode 20E2 of the LED element 20A and the electrode 20E2 of the LED element 20B through the conductor pattern CP1.

As shown in FIG. 11, in plan view, the terminal TM3 is arranged at a position overlapping the LED element 20B. The terminal TM2 is arranged to straddle the pixel PIXA and the pixel PIXB. The terminal TM2 includes an opening TMH1 and an opening TMH2 spaced apart from the opening TMH1. The LED element 20A is arranged inside the opening TMH1, and the LED element 20B is arranged inside the opening TMH2.

In this modification example, since the terminal TM2 is arranged to straddle the plurality of pixels PIX, an area of a region of the surface 14$f$ of the insulating layer 14, the region being covered with the terminal TM2, is larger than that of the display region DSP1 shown in FIG. 4. When the terminal TM2 is used as the visible-light reflecting member, the large area of the terminal TM2 can increase the amount of light reflected by the terminal TM2.

In the case of the example shown in FIG. 12, note that the power supply line PL2 connected to the terminal TM2 through the contact hole CH3 also straddles the plurality of pixels as similar to the terminal TM2. The large areas of the terminal TM2 and the power supply line PL2 can stabilize the common potential supplied to the power supply line PL2.

The display apparatus DSP4 shown in FIGS. 11 and 12 is the same as the display apparatus DSP1 described with reference to FIGS. 1 to 6, except for the above-described differences. Therefore, duplicated description will be omitted.

Fourth Modification Example

Figure 13:
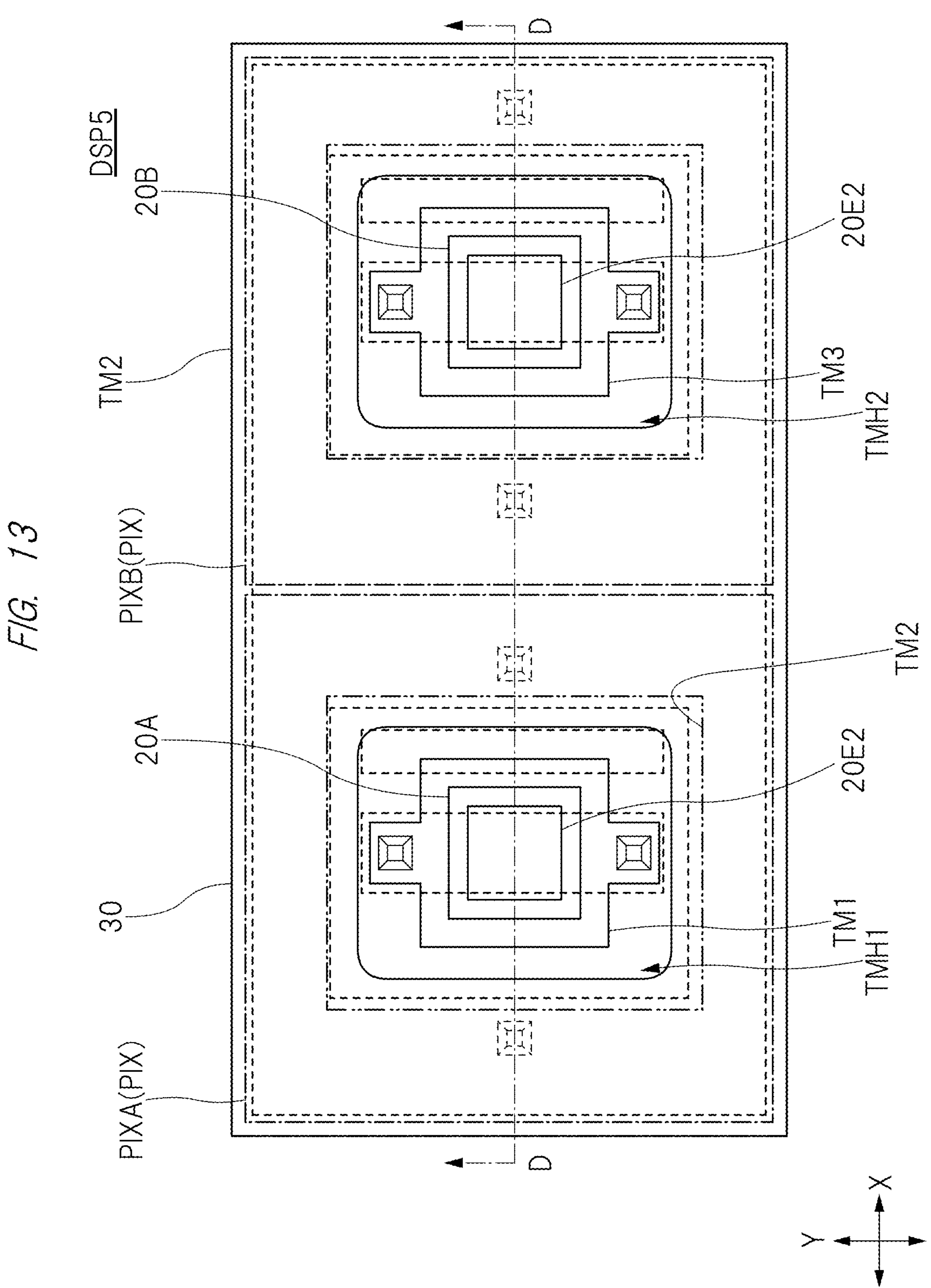
FIG. 13 is an enlarged transparent plan view showing a modification example relative to FIG. 11.
Figure 14:
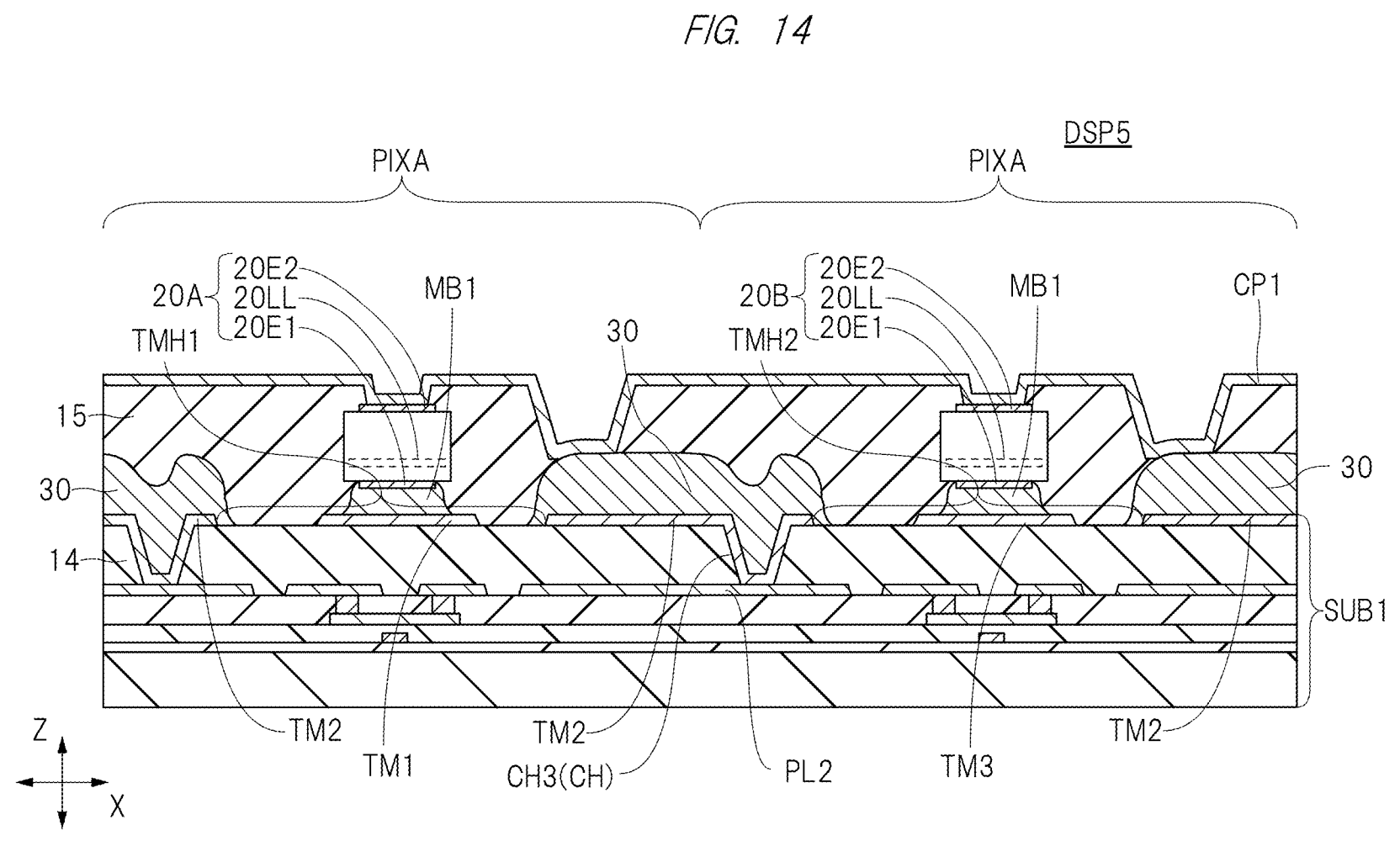

Next, a modification example of the display apparatus DSP4 described with reference to FIGS. 11 and 12 will be described. FIG. 13 is an enlarged transparent plan view showing a modification example relative to FIG. 11. FIG. 14 is an enlarged cross-sectional view taken along a line D-D of FIG. 13.

The display apparatus DSP5 shown in FIGS. 13 and 14 differs from the display apparatus DSP4 shown in FIGS. 11 and 12 in that the terminal TM2 is covered with the metal layer 30. As shown in FIG. 13, the metal layer 30 in plan view is arranged to continuously surround the LED element 20.

A function and a material of the metal layer 30 are the same as those of the metal layer 30 included in the display apparatus DSP2 described with reference to FIGS. 7 to 9. The metal layer 30 is formed to cover the entire terminal TM2. Therefore, a surface area of the metal layer 30 included in the display apparatus DSP5 is larger than a surface area of the metal layer 30 included in the display apparatus DSP2 described with reference to FIGS. 7 to 9. The metal layer 30 is used as the visible-light reflecting member. According to this modification example, the large surface area of the metal layer 30 can increase the amount of light reflected by the metal layer 30.

Method of Manufacturing Display Apparatus

Next, a method of manufacturing the display apparatus described above will be described. In this section, as a representative example, a method of manufacturing the display apparatus DSP2 described with reference to FIGS. 7 to 9 will be described. In this section, a step of forming a bump electrode MB1 and the metal layer 30 shown in FIG. 9 will be mainly described.

Figure 15:
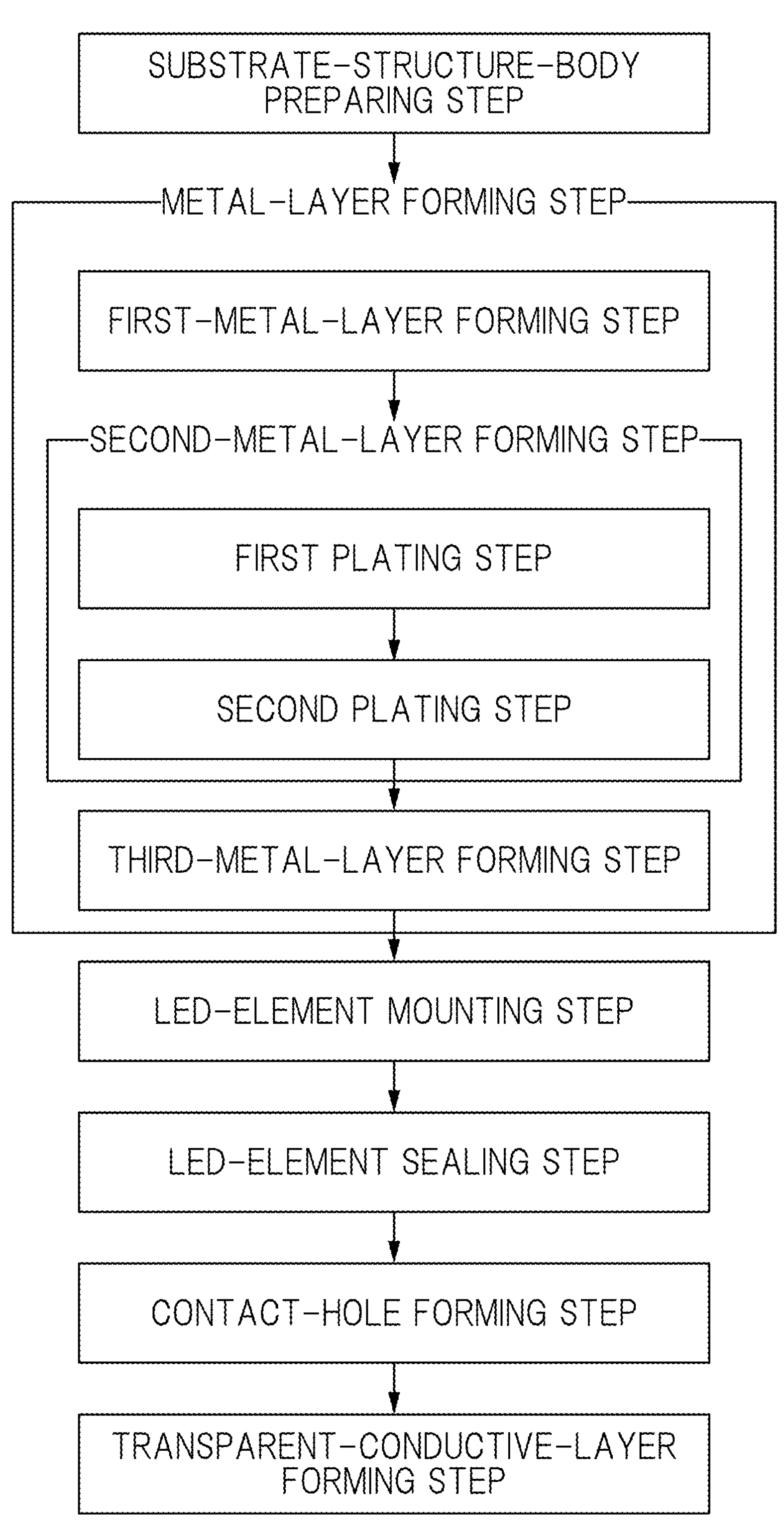
FIG. 15 is a flowchart showing an example of a method of manufacturing the display apparatus.

FIG. 15 is a flowchart showing an example of the method of manufacturing the display apparatus. The method of manufacturing the display apparatus shown in FIG. 15 includes a substrate-structure preparing step, a metal-layer forming step, an LED-element mounting step, an LED-element sealing step, a contact-hole forming step and a transparent-conductive-layer forming step.

In the substrate-structure preparing step shown in FIG. 15, the substrate structure SUB1 shown in FIG. 9 is prepared. The substrate structure SUB1 includes a substrate 10, a plurality of wiring layers (wiring layers WL1, WL2, WL3) and a plurality of insulating layers (insulating layers 11, 12, 13, 14) stacked on the surface 10*f* of the substrate 10. Among the plurality of insulating layers of the substrate structure SUB1, the insulating layer 14 located at the topmost layer has a surface 14*f*. The terminal TM2 is formed on the surface 14*f* of the insulating layer 14. As shown in FIG. 8, the terminal TM1 in plan view is arranged at a position overlapping the LED element 20. The terminal TM2 in plan view is arranged to continuously surround the LED element 20.

Next, the metal-layer forming step shown in FIG. 15 includes a first-metal-layer forming step, a second-metal-layer forming step, and a third-metal-layer forming step. Each of FIGS. 16 to 19 schematically shows a state in which the metal film is deposited by the metal-layer forming step shown in FIG. 15 using an electroplating method. In each of the first-metal-layer forming step, the second-metal-layer forming step and the third-metal-layer forming step, the metal film is selectively deposited on the terminal TM1 and the terminal TM2 by an electroplating method of performing a plating method while making electric current flow in one or both of the terminals TM1 and TM2. Of the metal film deposited in this step, the metal film deposited on the terminal TM1 becomes the bump electrode MB1 shown in FIG. 9, and the metal film deposited on the terminal TM2 becomes the metal layer 30 shown in FIG. 9.

Figure 16:
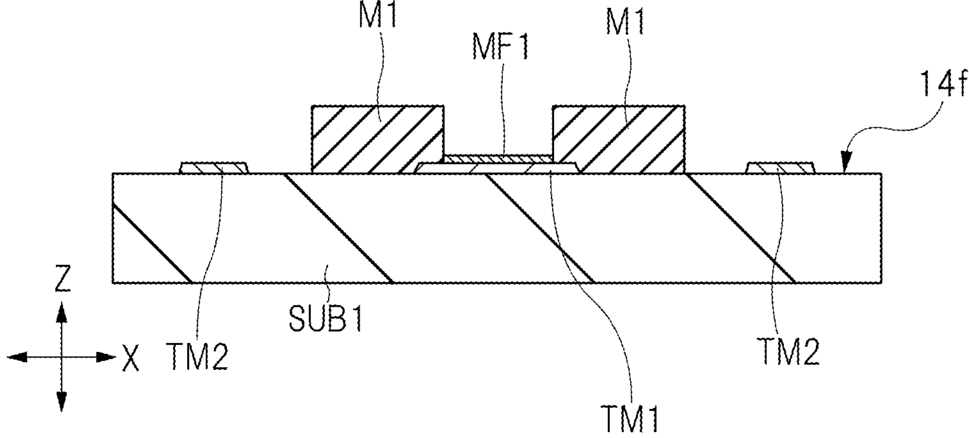
FIG. 16 is an enlarged cross-sectional view showing a first-metal-layer forming step shown in FIG. 15.

As shown in FIG. 9, in the case of the present embodiment, the bump electrode MB1 is selectively formed on a part of the terminal TM1. In order to selectively form the bump electrode MB1 on the part of the terminal TM1 as shown in FIG. 9, a mask RM1 is used in this step as shown in FIG. 16. The mask RM1 is an organic insulating film. The mask M1 is formed to cover the terminal TM1. In the mask M1, the terminal TM1 partially includes an opening, and a region of the terminal TM1 where the bump electrode MB1 (see FIG. 9) is to be formed is exposed at the opening from the mask M1.

In the first-metal-layer forming step shown in FIG. 15, a metal film MF1 is formed on the part of the terminal TM1 exposed from the mask M1. The metal film MF1 is made of, for example, copper or copper alloy containing copper as a main component. This step is performed under the electroplating method as described above. In this step, the plating step is performed in a state in which the electric current flows through the terminal TM1 while the electric current does not flow through the terminal TM2. In this case, the metal film MF1 is selectively formed on the part of the terminal TM1 exposed from the mask M1 as shown in FIG. 16.

Figure 17:
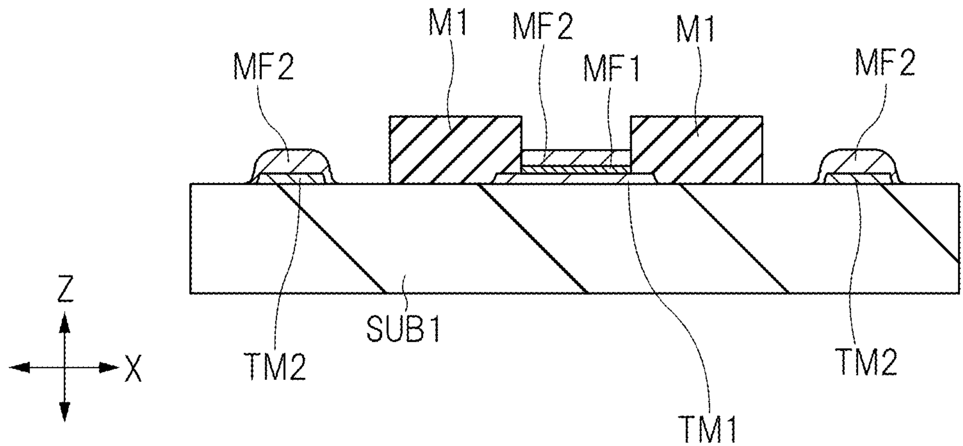
FIG. 17 is an enlarged cross-sectional view showing a first plating step shown in FIG. 15.
Figure 18:
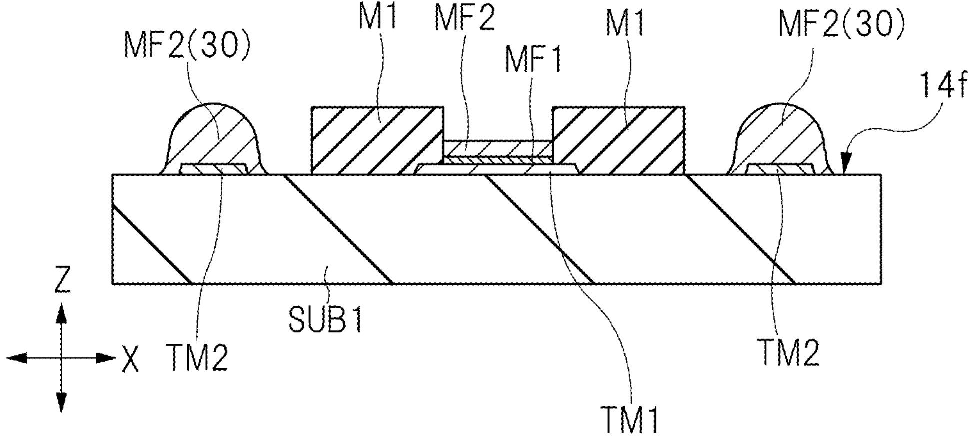
FIG. 18 is an enlarged cross-sectional view showing a second plating step shown in FIG. 15.

Next, in the second-metal-layer forming step shown in FIG. 15, the metal film MF2 shown in FIG. 17 and FIG. 18 is formed. The metal film MF2 is made of, for example, nickel or nickel alloy containing nickel as a main component. As shown in FIG. 15, the second-metal-layer forming step includes a first plating step and a second plating step. In the first plating step, as shown in FIG. 17, a metal film MF2 is formed on the terminal TM2 and the terminal TM1 (more specifically, on the metal film MF1 formed on the terminal TM1) by an electroplating method. At this time, the plating step is performed in a state in which the electric current flows through each of the terminal TM1 and the terminal TM2. In this case, the metal film MF2 is formed on the exposed surface of the terminal TM2 and the metal film MF1 formed on the terminal TM1, respectively.

Next, in the second plating step, the plating step is continued in a state in which the flow of the electric current through the terminal TM1 is stopped while the flow of the electric current through the terminal TM2 is continued. In this case, the metal film MF2 covering the terminal TM2 further grows to provide the metal layer 30 as shown in FIG. 18.

Figure 19:
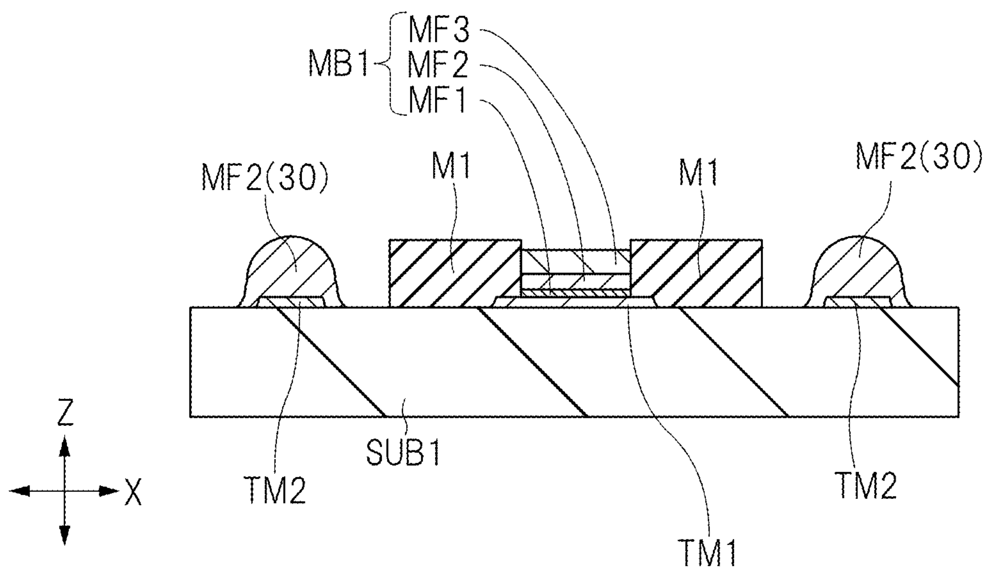
FIG. 19 is an enlarged cross-sectional view showing a second-metal-layer forming step shown in FIG. 15.

On the other hand, since the potential supply to the terminal TM1 is stopped, the metal film MF2 formed on the metal film MF1 does not grow in the second plating step. Next, in the third-metal-layer forming step shown in FIG. 15, a metal film MF3 shown in FIG. 19 is formed. The metal film MF3 is made of, for example, tin or tin alloy containing tin as a main component. This step is performed under the electroplating method as described above. In this step, the plating step is performed in a state in which the electric current flows through the terminal TM1 while no electric current flows through the terminal TM2. In this case, the metal film MF3 is selectively formed on a part of the terminal TM1 exposed from the mask M1 (more specifically, on the metal film MF2 deposited on the metal film MF1 formed on the terminal TM1) as shown in FIG. 19.

Although not illustrated, the metal-layer forming step includes a step of removing the mask M1 shown in FIG. 19 (that is a mask removal step) after the third-metal-layer forming step shown in FIG. 15. The following steps provide the bump electrode MB1 and the metal layer 30 shown in FIG. 9.

Note that there are various modification examples of the metal-layer forming step shown in FIG. 15. For example, when the metal layer 30 (see FIG. 9) is a stacked film of a copper film and a nickel film, the plating step in the first-metal-layer forming step shown in FIG. 15 is performed in a state in which the electric current flows through both the terminal TM1 and the terminal TM2.

Next, in the LED-element mounting step shown in FIG. 15, the LED element 20 shown in FIG. 9 is prepared, and the electrode 20E1 of the LED element 20 is bonded to the bump electrode MB1. In this step, a contact interface between the bump electrode MB1 and the electrode 20E1 is heated by, for example, laser irradiation not illustrated, to bond the bump electrode MB1 and the electrode 20E1.

Next, in the LED-element sealing step shown in FIG. 15, an insulating layer 15 is formed on the surface 14*f* of the insulating layer 14 shown in FIG. 9 to seal the LED element 20, the terminal TM1, the terminal TM2, and the metal layer 30.

Next, in the contact-hole forming step shown in FIG. 15, an opening (contact hole) is formed by etching on a part of the insulating layer 15 shown in FIG. 9. In this step, parts of the electrode 20E2 of the LED element 20 and the metal layer 30 are exposed from the insulating layer 15.

Next, in the transparent-conductive-layer forming step shown in FIG. 15, the conductor pattern CP1 made of a transparent conductive material is formed on the surface 15F of the insulating layer 15 shown in FIG. 9. By this step, the electrode 20E2 of the LED element 20 and the terminal TM2 are electrically connected to each other through the conductor pattern CP1 and the metal layer 30.

The embodiments the typical modification examples have been described above. The above-described technique is also applicable to various modification examples other than the exemplified modification examples. For example, the above-described modification examples may be combined with each other.

In the scope of the idea of the present invention, various modification examples and alteration examples can be easily conceived by those who are skilled in the art, and it would be understood that these various modification examples and alteration examples also belong to the scope of the present invention. For example, the ones obtained by appropriate addition, removal, or design-change of the components to/from/into each of the above-described embodiments or obtained by addition, omitting, or condition-change of the step to/from/into each of the above-described embodiments by those who are skilled in the art are also within the scope of the present invention as long as the ones include the concept of the present invention.

The present invention is applicable to a display apparatus and an electronic device into which the display apparatus is embedded.

What is claimed is:

1. A display apparatus comprising:
- a first inorganic light emitting diode element including a first electrode on a first main surface and a second electrode on a second main surface opposite to the first main surface;
- a first terminal electrically connected to the first electrode;
- a second terminal electrically connected to the second electrode;
- a first insulating layer covering the first terminal, the first inorganic light emitting diode element and the second terminal; and
- a first conductor pattern arranged on the first insulating layer and electrically connected to each of the second electrode and the second terminal of the first inorganic light emitting diode element,
- wherein, in plan view,
- the first terminal is at a position overlapping the first inorganic light emitting diode element, and
- the second terminal is arranged to continuously surround the first inorganic light emitting diode element.

2. The display apparatus according to the claim 1,
- wherein the second terminal is covered with a first metal layer, and
- in plan view, the first metal layer is arranged to continuously surround the first inorganic light emitting diode element.

3. The display apparatus according to the claim 2,
- wherein the first terminal and the second terminal are arranged on a first surface of a second insulating layer, and
- when the first surface of the second insulating layer is a reference plane, a height of a top of the first metal layer from the reference plane is larger than a height of a light emitting layer of the first inorganic light emitting diode element from the reference plane.

4. The display apparatus according to the claim 3,
- wherein the height of the top of the first metal layer from the reference plane is equal to or smaller than a height of the second main surface of the first inorganic light emitting diode element from the reference plane.

5. The display apparatus according to the claim 2,
- wherein the first terminal and the second terminal are arranged on a first surface of a second insulating layer, and
- a distance from a top of the first metal layer to the second terminal is larger than a thickness of the second terminal.

6. The display apparatus according to the claim 2,
- wherein the first metal layer includes a first side surface facing the first inorganic light emitting diode element through the first insulating layer, and
- the first side surface has a curved surface.

7. The display apparatus according to the claim 2,
- wherein a bump electrode is formed between the first terminal and the first electrode of the first inorganic light emitting diode element so that the first terminal is electrically connected to the first electrode through the bump electrode, and
- at least a part of a material configuring the bump electrode contains the same material as a material configuring the first metal layer.

8. The display apparatus according to the claim 2,
- wherein the first metal layer in plan view has an annular shape.

9. The display apparatus according to claim 1 further comprising:
- a second inorganic light emitting diode element including the first main surface, the second main surface, the first electrode and the second electrode; and
- a third terminal electrically connected to the first electrode of the second inorganic light emitting diode element,
- wherein is the second terminal electrically connected to the second electrode of the second inorganic light emitting diode element,
- in plan view,
- the third terminal is at a position overlapping the second inorganic light emitting diode element,
- the second terminal includes a first opening and a second opening spaced apart from the first opening,
- the first inorganic light emitting diode element is arranged inside the first opening, and
- the second inorganic light emitting diode element is arranged inside the second opening.

10. The display apparatus according to the claim 8,
- wherein the second terminal is covered with a metal layer, and
- the metal layer in plan view is arranged to continuously surround the first inorganic light emitting diode element.

* * * * *